(12) United States Patent
Leussler et al.

(10) Patent No.: US 9,869,735 B2
(45) Date of Patent: Jan. 16, 2018

(54) MRI COIL ASSEMBLY WITH A RADIO FREQUENCY SHIELD SWITCHABLE BETWEEN A BLOCKING STATE AND A TRANSPARENT STATE

(71) Applicant: KONINKLIJKE PHILIPS N.V., Eindhoven (NL)

(72) Inventors: Christoph Leussler, Hamburg (DE); Daniel Wirtz, Hamburg (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 944 days.

(21) Appl. No.: 14/352,030

(22) PCT Filed: Oct. 3, 2012

(86) PCT No.: PCT/IB2012/055289
§ 371 (c)(1),
(2) Date: Apr. 15, 2014

(87) PCT Pub. No.: WO2013/057612
PCT Pub. Date: Apr. 25, 2013

(65) Prior Publication Data
US 2014/0253122 A1    Sep. 11, 2014

Related U.S. Application Data

(60) Provisional application No. 61/548,287, filed on Oct. 18, 2011.

(51) Int. Cl.
*G01R 33/421* (2006.01)
*G01R 33/422* (2006.01)
(Continued)

(52) U.S. Cl.
CPC ....... *G01R 33/4215* (2013.01); *G01R 33/422* (2013.01); *G01R 33/3415* (2013.01); *G01R 33/3635* (2013.01); *G01R 33/481* (2013.01)

(58) Field of Classification Search
CPC .............. G01R 33/4215; G01R 33/422; G01R 33/3415; G01R 33/3635; G01R 33/481
See application file for complete search history.

(56) References Cited

U.S. PATENT DOCUMENTS

| 5,419,325 A | 5/1995 | Dumoulin |
| 5,808,467 A | 9/1998 | Ochi |

(Continued)

FOREIGN PATENT DOCUMENTS

| EP | 0629875 B1 | 7/2002 |
| WO | 2011070466 A1 | 6/2011 |

OTHER PUBLICATIONS

International Search Report dated Feb. 8, 2013 for Application No. PCT/IB2012/055289 (Provided by Applicant).*

(Continued)

*Primary Examiner* — Rodney Bonnette

(57) ABSTRACT

A magnetic resonance imaging system (300, 400) acquires magnetic resonance data (342). The magnetic resonance imaging system includes a coil assembly (319) configured for radiating and/or receiving radio frequency energy from an imaging zone. The coil assembly has a first surface (315) configured for being directed towards the imaging zone and includes at least one coil element (317). The coil assembly further comprises a radio frequency shield (319) switchable between an RF blocking state (804) and an RF transparent state (802). The at least one coil element is between the first surface and the radio frequency shield. The switchable radio frequency shield includes at least two conductive elements (322). The radio frequency shield includes at least one radio frequency switch (324) configured for electrically connecting the at least two conductive elements in the blocking state and disconnecting the at least two conductive elements in the transparent state.

13 Claims, 21 Drawing Sheets

(51) Int. Cl.
*G01R 33/3415* (2006.01)
*G01R 33/36* (2006.01)
*G01R 33/48* (2006.01)

(56) References Cited

U.S. PATENT DOCUMENTS

| | | |
|---|---|---|
| 6,498,947 B2 | 12/2002 | Boskamp |
| 2002/0079894 A1 | 6/2002 | Boskamp |
| 2003/0155918 A1 | 8/2003 | Young |
| 2005/0073308 A1 | 4/2005 | Havens |
| 2009/0251145 A1 | 10/2009 | Kaneko |
| 2010/0039111 A1* | 2/2010 | Luekeke .............. G01R 33/341 324/318 |
| 2010/0156412 A1 | 6/2010 | Biber |

OTHER PUBLICATIONS

Vazquez et al "Waveguide Magnetic Resonance Imaging at 3 Tesla" Proc. Intl. Soc. Mag. Reson. Med. 18 (2010) p. 3792.

\* cited by examiner

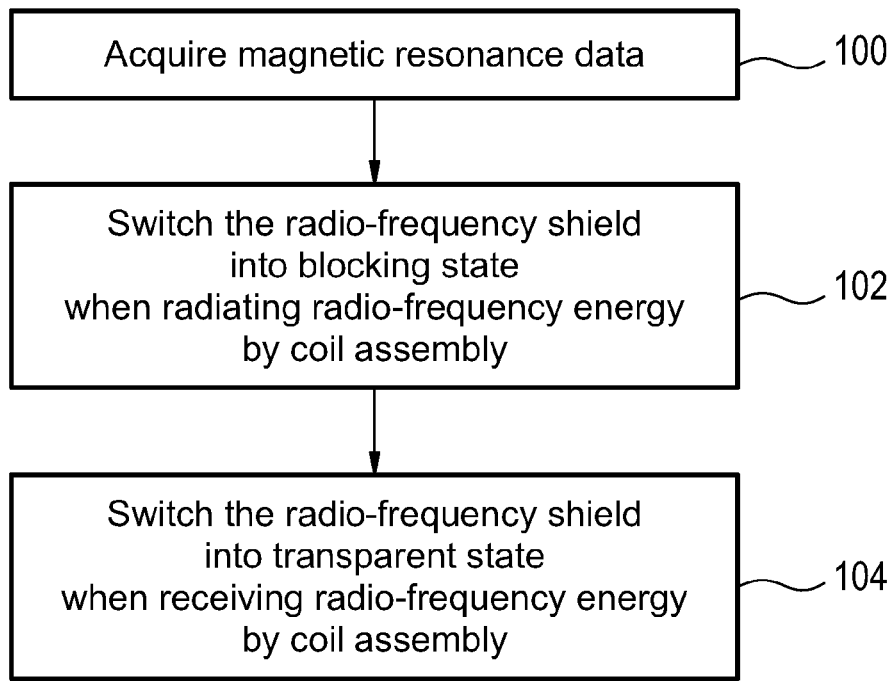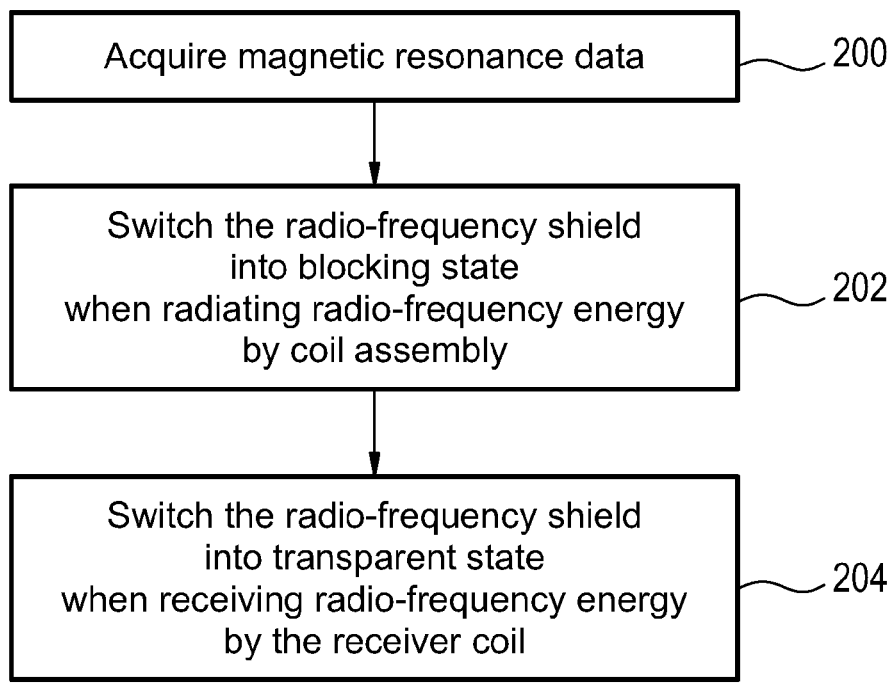

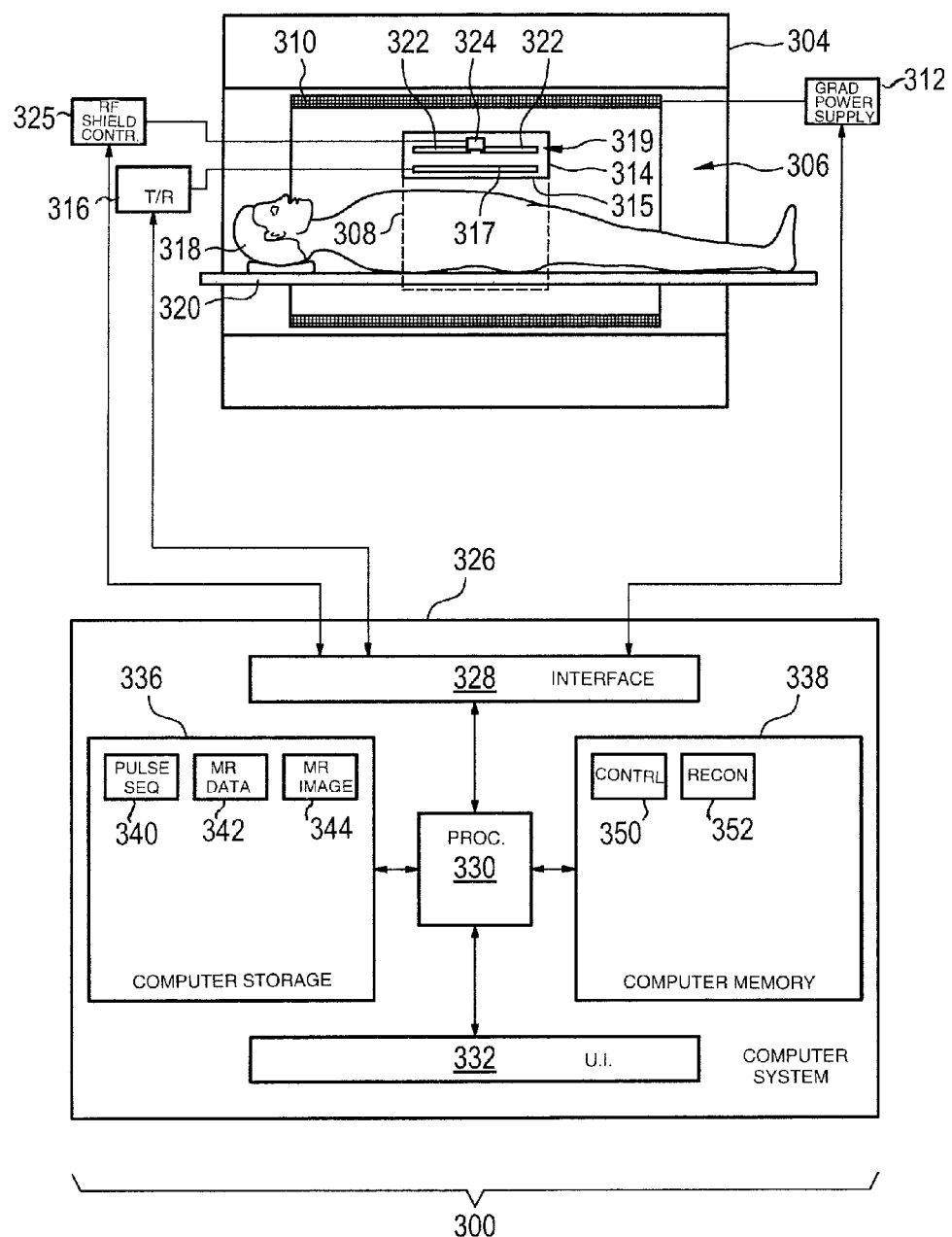

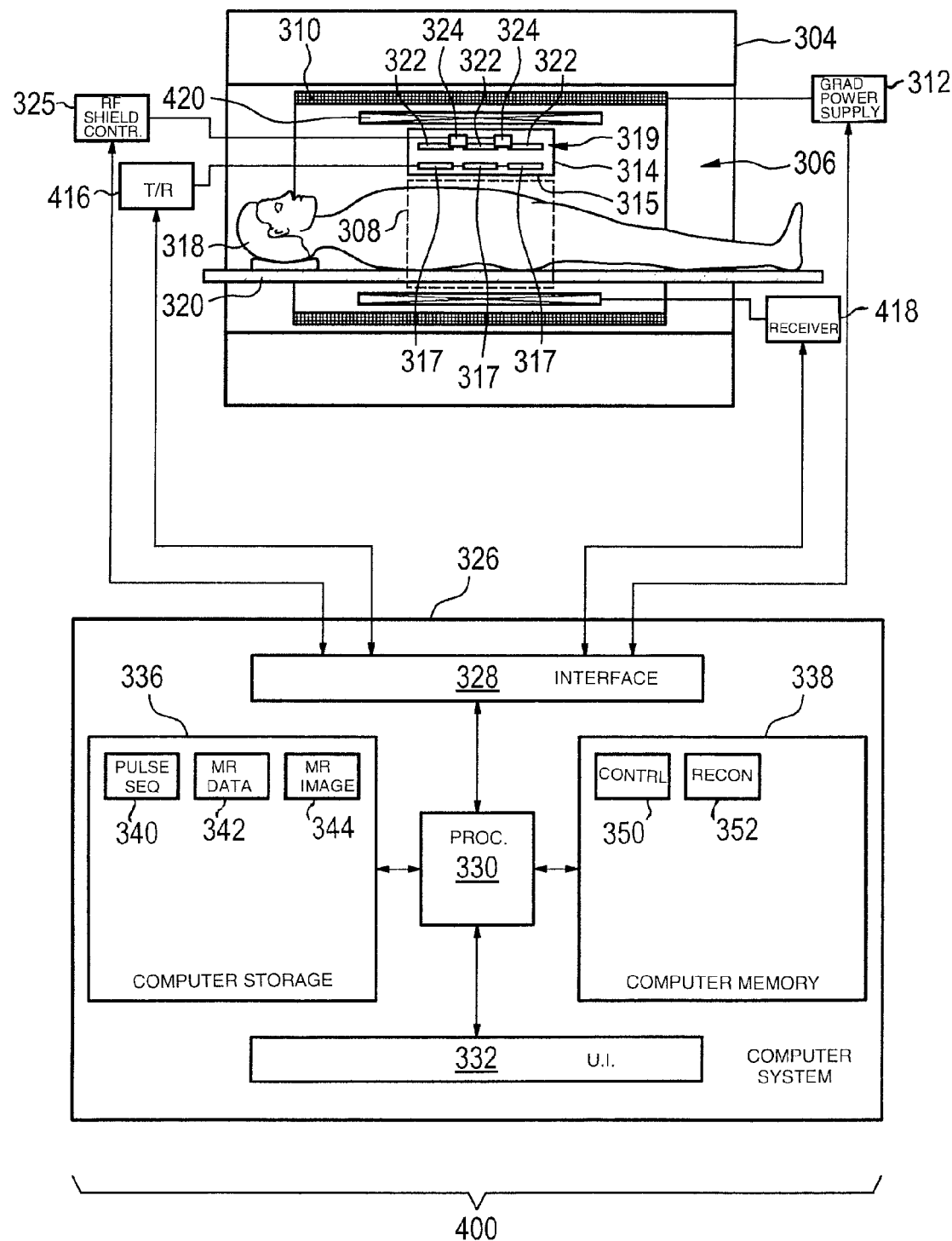

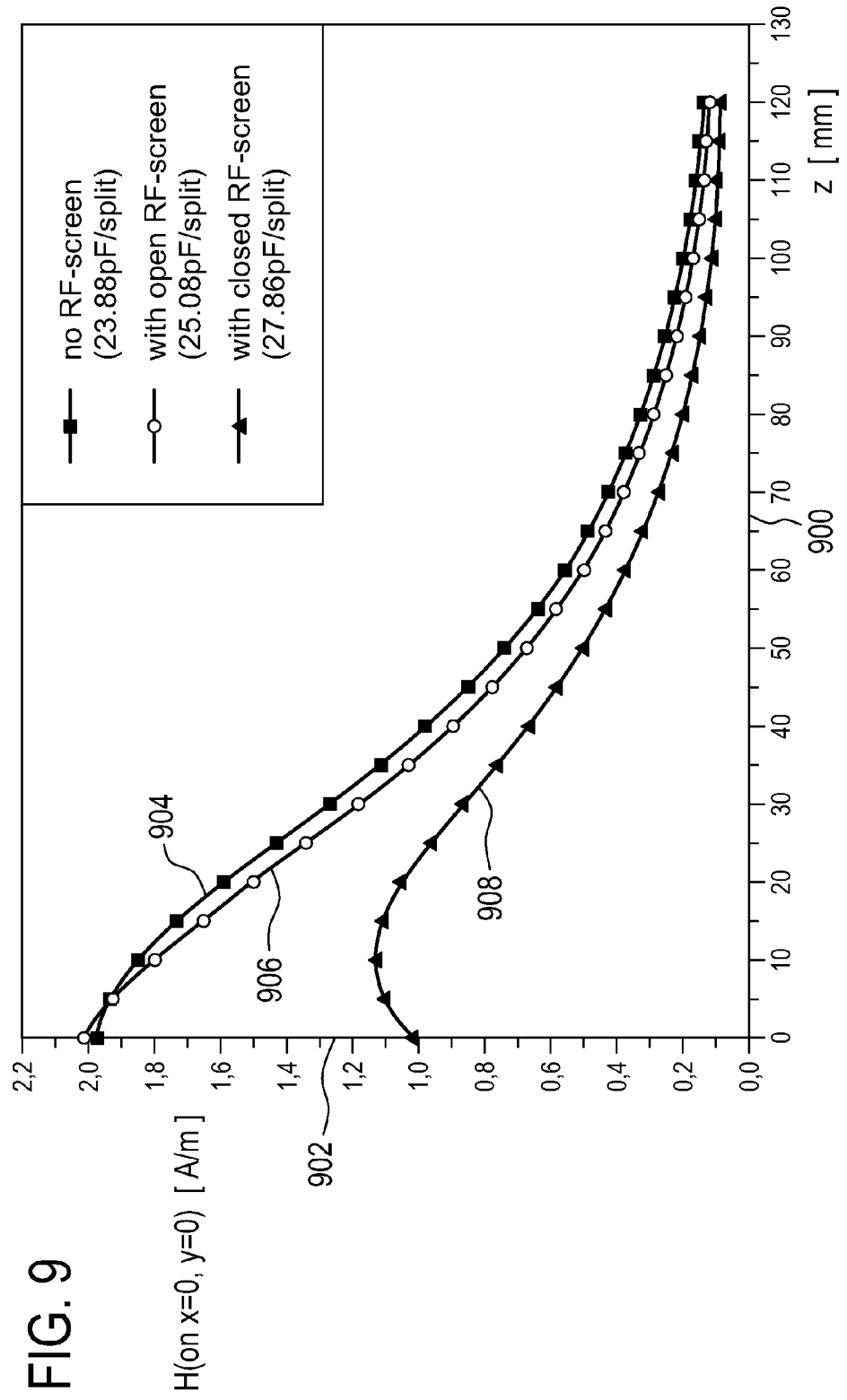

MRI COIL ASSEMBLY WITH A RADIO FREQUENCY SHIELD SWITCHABLE BETWEEN A BLOCKING STATE AND A TRANSPARENT STATE

CROSS-REFERENCE TO PRIOR APPLICATIONS

This application is the U.S. National Phase application under 35 U.S.C. §371 of International Application No. PCT/IB2012/055289, filed on Oct. 3, 2012, which claims the benefit of U.S. Provisional Patent Application No. 61/548, 287, filed on Oct. 18, 2011. These applications are hereby incorporated by reference herein.

TECHNICAL FIELD

The invention relates to magnetic resonance imaging, in particular to a coil assembly with a switchable radio frequency shield.

BACKGROUND OF THE INVENTION

A magnetic field is used in Magnetic Resonance (MR) Imaging to align the nuclear spins of atoms as part of the procedure for producing images within the body of a patient. This magnetic field is referred to as the B0 field. During an MR scan, Radio Frequency (RF) pulses generated by a transmitter or amplifier and an antenna cause perturbations to the local magnetic field and can be used to manipulate the orientation of the nuclear spins relative to the B0 field. Radio Frequency (RF) signals emitted by the nuclear spins are detected by a receiver coil, and these RF signals are used to construct the MRI images.

In most MR-systems to date a volume coil (e.g. quadrature body coil, QBC) is used to transmit the high power signals for spin excitation. For whole body imaging this is the standard setup for up to 3T. For head imaging volume transmitters are applied at 7T and beyond.

In most such magnetic resonance imaging systems, multichannel receive arrays are employed for improved signal reception and accelerated imaging protocols. This holds true for all anatomies and all field strengths.

A disadvantage of current multichannel systems is that there may be coupling between the antennas or antenna elements for each channel.

SUMMARY OF THE INVENTION

The invention provides for a magnetic resonance imaging system, a coil assembly, and a computer program product in the independent claims. Embodiments are given in the dependent claims.

Embodiments of the invention may address this or other problems by using a switchable radio frequency shield to reduce coupling between antenna elements used to transmit the radio frequency energy.

Embodiments of the invention may employ a switchable RF-screen to shield and/or decouple transmit/receive (Tx-Rx) surface coils. This may provide several improvements over conventional coils or coil arrays used for Tx-Rx operation: During the transmit phase the RF-screen is switched to a conventional, RF-blocking mode, thus preventing the coil element from radiating a significant amount of its driving RF power. Moreover, a screen close by allows for much easier decoupling of neighboring coil elements, which is beneficial for parallel transmission. Both items mentioned are especially crucial in high field applications.

During the receive phase, suitable switches (e.g. PIN-diodes) open the RF-screen improving the receive sensitivity of each element. As a by-product, the electric fields, present during transmit phase are successfully suppressed resulting in relaxed SAR performance.

Some embodiments may use a local RF-screen to local TxRx coils in such a way, that electrical switches (e.g. PIN-diodes) allow for changing the behavior of such a screen. During transmit mode, the switches connect the pieces of the RF-screen such that an RF-blocking behavior is achieved. These results in suppressed radiation losses of the coil during transmit and reduces coupling to neighboring elements which is mandatory for parallel transmit arrays. Furthermore the electrical fields are significantly suppressed improving SAR-behavior of such a coil. The electromagnetic radiation is confined to the requested Field of View (FOV).

During the receive mode, the switches open the RF-screen segmenting it in several small pieces which are electrically isolated from each other. The sensitivity of the coil element is thus significantly improved compared to the Tx phase allowing for accelerated imaging (e.g. SENSE).

Embodiments of the invention may address the following problems, especially in high field applications (3T, 7T):
radiative losses of coils are becoming a major issue
radiation to body parts outside FOV (back folding, SAR, additional losses, local hot spots located in arms, shoulder parts and head,)
coupling between coil elements is always a big issue, especially for parallel transmitting applications.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, punched tape, punch cards, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa. References to 'computer storage' or 'storage' should be interpreted as possibly being multiple storage mediums or devices. The storage may for instance be multiple storage devices within the same computer system or computing device. The storage may also be multiple storages distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, one or more switches, one or more buttons, and accelerometer are all examples of user interface components which enable the receiving of information or data from an operator.

A 'hardware interface' as used herein encompasses a interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system for acquiring magnetic resonance data from a subject. The magnetic resonance imaging system comprises a magnet for providing an imaging zone. The magnetic resonance imaging system further comprises a coil assembly configured for eradiating radio-frequency energy into and/or receiving radio-frequency energy from the imaging zone during the acquisition of the magnetic resonance imaging data. The coil assembly has a first surface configured for being directed towards the imaging zone. The first surface may for instance be the outer surface of the coil assembly which is in contact with the subject. The coil assembly further comprises at least one coil element. The coil element is a radio-frequency coil or antenna element which is configured for eradiating radio-frequency energy and/or receiving radio-frequency energy. In some embodiments there are multiple coil elements. If there are multiple coil elements each of the coil elements may be configured for eradiating and/or receiving radio-frequency energy or there may be a combination of some coil elements which are configured for eradiating radio-frequency energy and other coil elements which are configured for receiving radio-frequency energy.

The coil assembly further comprises a radio-frequency shield switchable between a blocking state and a transparent state. The at least one coil element is between the first surface and the switchable radio-frequency shield. The switchable radio-frequency shield comprises at least two conductive elements. The conductive elements for instance may be surfaces of conductive material. They may for instance be thin films or layers of conductive foil or may be sections of conductive screen. The radio-frequency shield comprises at least one radio-frequency switch configured for electrically connecting the at least two conductive elements when the radio-frequency shield is in the blocking state. The at least one radio-frequency switch is further configured for electrically disconnecting the at least two conductive elements when the radio-frequency shield is in the transparent state.

When the radio-frequency shield is in the transparent state the attenuation of radio-frequency energy is less than when it is in the blocking state. Essentially the conductive elements in the transparent state are left in a floating or unconnected state. They are sufficiently small that they do not significantly attenuate the radio-frequency energy. However, when the switches are connected then the conductive elements function or act as a larger conductive element. This more effectively blocks radio-frequency energy causing attenuation of the radio-frequency energy to be greater than when it is in the transparent state. In some embodiments when the radio-frequency shield is in the transparent state there is still some attenuation of the radio-frequency energy.

This embodiment may be beneficial for several different cases. The radio-frequency shield may be used to protect sensitive tissues away from the imaging zone or electronics. When the radio-frequency shield is in the blocking state the tissue and/or electronics are protected. If there are multiple coil elements it may be beneficial to use a radio-frequency shield because it may lead to greater decoupling of the various coil elements.

In another embodiment the coil assembly is configured for eradiating radio-frequency energy into and for receiving radio-frequency energy from the imaging zone during the acquisition of magnetic resonance imaging. In some embodiments the same coil elements are used for both and in others there are separate coil elements for transmitting and for receiving. The magnetic resonance imaging system further comprises a processor for controlling the operation of the magnetic resonance imaging system. The magnetic resonance imaging system further comprises a memory for storing machine executable instructions for execution by the processor. Execution of the instructions causes the processor to acquire the magnetic resonance data by controlling the magnetic resonance imaging system. Execution of the instructions further causes the processor to switch the radio-frequency shield into the blocking state when eradiating radio-frequency energy by the coil assembly. Execution of the instructions further causes the processor to switch the radio-frequency shield into the transparent state during reception of the radio-frequency transmission by the coil assembly. This embodiment may be beneficial because when the coil assembly is eradiating radio-frequency energy the RF shield contains the region into which the coil assembly is eradiating. Switching the coil assembly into the transparent state may make the coil assembly more sensitive to the radio-frequency transmissions.

In another embodiment the coil assembly is configured for irradiating radio-frequency energy into the imaging zone during the acquisition of magnetic resonance imaging. The magnetic resonance imaging system further comprises at least one receiver coil configured for receiving radio-frequency signals from atomic spins within the imaging zone during the acquisition of the magnetic resonance data. In some embodiments the receiver coil is separate from the coil assembly. For instance the receiver coil may be a body coil mounted on the inside of the bore of a magnetic resonance magnet and the coil assembly may for instance be a surface coil which is placed in contact with the subject. The magnetic resonance imaging system further comprises a processor for controlling the operation of the magnetic resonance imaging system. The magnetic resonance imaging system further comprises a memory for storing machine executable instructions for execution by the processor. Execution of the instructions causes the processor to acquire the magnetic resonance data by controlling the magnetic resonance imaging system. Execution of the instructions further causes the processor to switch the radio-frequency shield into the blocking state when eradiating radio-frequency energy via the coil assembly. Execution of the instructions further causes the processor to switch the radio-frequency shield into the transparent state during the reception of the radio-frequency coil by the receiver coil. This embodiment may be beneficial because the radio-frequency shield may interfere with the reception of the radio-frequency energy by the receiver coil. By switching it into the transparent state the transmission of the radio-frequency energy through the radio-frequency shield is increased.

In another embodiment the memory of the magnetic resonance imaging system contains a pulse sequence. The pulse sequence as used herein comprises a set of instructions that are performed at a particular sequence in time in order to operate the magnetic resonance imaging system to acquire magnetic resonance data. The pulse sequence may detail when the radio-frequency shield is switched into the transparent state and when it is switched into the blocking state.

In another embodiment at least one coil element comprises a controllable matching network element for impedance matching of at least one coil element. The controllable matching network element may be a matching network or a portion of a matching network for impedance matching the coil element. The matching network may be switched between two different impedances or it may be continuously adjustable. Execution of the instructions further causes the processor to adjust the controllable matching network to compensate for the effect of the impedance change of the at least one coil element due to switching the radio-frequency shield between the blocking state and the transparent state.

In another embodiment the memory further comprises a sensitivity encoding pulse sequence. The magnetic resonance data is acquired by executing the sensitivity encoded pulse sequence. This embodiment may be beneficial because the radio-frequency shield may reduce the coupling between multiple elements in the coil assembly. Sensitivity encoding pulse sequences function by determining the sensitivity of the individual coil elements of a multi-element coil. By reducing the coupling between the individual coil elements the magnetic resonance data acquired with the sensitivity encoded pulse sequence may be more accurate.

In another embodiment the coil assembly further comprises at least one receiver coil configured for receiving radio-frequency transmissions from atomic spins within the imaging zone during the acquisition of the magnetic resonance data. The radio-frequency shield is located between the at least one coil element and the at least one receiver coil.

In another embodiment the coil assembly has a second surface configured for receiving a portion of the subject. The second surface is directed away from the imaging zone. The radio-frequency shield is between the second surface and that at least one coil element. The coil assembly has at least two outer surfaces. One surface is directed towards the imaging zone and one is directed away from it. Portions of the subject in contact or in the direction of the second surface will be shielded from radio-frequency energy generated by the coil assembly. This may help to reduce the radio-frequency heating in portions of the subject which are shielded by the radio-frequency shield.

In another embodiment the radio-frequency switch comprises at least one capacitor configured for tuning the radio-frequency shield to a blocking frequency when the radio-frequency shield is in the blocking state. This for instance may be accomplished by connecting the capacitor between the conductive element and a ground plane or even between two different conductive elements. This embodiment may be advantageous because the radio-frequency shield can be designed for absorbing a specific frequency or band of frequencies very efficiently. This may lead to a better functioning radio-frequency shield.

In another embodiment the radio-frequency switch comprises a PIN diode.

In another embodiment the radio-frequency switch comprises a micro electrical mechanical switch or MEMS switch.

In another embodiment the radio-frequency switch comprises a mechanical relay.

In another embodiment the coil assembly is further configured such that the at least one coil element is switched to a first resonant frequency when the radio-frequency shield is switched to the blocking state. The coil assembly is further configured such that the at least one coil element is switched to a second resonant frequency when the radio-frequency shield is switched to the transparent state. There will be capacitive coupling between the coil elements and the conductive elements. The amount of capacitance will of course vary between the blocking state and the transparent state. As a result each of the coil elements can be tuned to two specific frequencies that correspond to the switching states. This is particularly true is a capacitor is incorporated into the switch and is used for tuning the conductive elements and/or the coil element.

In another embodiment the coil assembly comprises multiple coil elements. The radio-frequency shield comprises multiple shield elements each comprising at least two conductive elements. Each of the multiple shield elements is configured for being switched independently between the blocking state and the transparent state. This embodiment is particularly advantageous because the coil elements can be used independently and the degree of coupling between the different coil elements can be controlled by switching between the blocking and the transparent state for the portion of the radio-frequency shield adjacent to each of the conductive elements.

In another embodiment at least one coil element is a loop coil.

In another embodiment at least one coil element is a butterfly coil.

In another embodiment the at least one coil element is a stripline coil.

In another embodiment the at least one coil element is a TEM transmit coil.

In another embodiment the at least one coil element is a TEM volume coil.

In another embodiment the at least one coil element is a TEM coil.

In another embodiment the at least one coil element is a birdcage coil. The at least one coil element may also be a birdcage volume coil.

In another embodiment the coil assembly further comprises an electronic component. The radio-frequency shield is between the at least one coil element and the electronic component. The radio-frequency shield is configured for shielding the electronic component from the at least one coil element when the radio-frequency shield is in the blocking state. This embodiment may be advantageous because it may protect sensitive electronics from radio-frequency energy emitted by the at least one coil element. The electronic component may be a positron emission tomography detector, a tuning and matching circuit, an impedance matching network, a preamplifier, an analogue-to-digital converter, and/or a power amplifier.

In another aspect the invention provides for a coil assembly for eradiating radio-frequency energy and/or receiving radio-frequency energy during the acquisition of magnetic resonance imaging data. The coil assembly has a first surface configured for being directed towards an imaging zone of a magnetic resonance imaging system. The coil assembly further comprises at least one coil element. The coil assembly further comprises a radio-frequency shield switchable between a blocking state and a transparent state. The at least one coil element is between the first surface and the switchable radio-frequency shield. The switchable radio-frequency shield comprises at least two conductive elements. The radio-frequency shield comprises a radio-frequency switch configured for electrically connecting the at least two conductive elements when the radio-frequency shield is in the blocking state. The radio-frequency switch is further configured for electrically disconnecting the at least two conductive elements when the radio-frequency shield is in the transparent state. The advantages of this embodiment have been previously discussed.

In another aspect the invention provides for a computer program product comprising machine executable code for execution of the processor controlling the magnetic resonance imaging system. The magnetic resonance imaging system comprises a magnet for providing the imaging zone. The magnetic resonance imaging system further comprises a coil assembly according to an embodiment of the invention. The coil assembly is configured for eradiating radio-frequency energy and for receiving radio-frequency energy. Execution of the instructions causes the processor to acquire the magnetic resonance data by controlling the magnetic resonance imaging system. Execution of the instructions further causes the processor to switch the radio-frequency shield into the blocking state when eradiating radio-frequency energy by the coil assembly. Execution of the instructions further causes the processor to switch the radio-frequency shield into the transparent state during reception of the radio-frequency transmission by the coil assembly. The advantages of this embodiment have been previously discussed.

BRIEF DESCRIPTION OF THE DRAWINGS

In the following preferred embodiments of the invention will be described, by way of example only, and with reference to the drawings in which:

FIG. 1 shows a flow chart which illustrates a method according to an embodiment of the invention;

FIG. 2 shows a flow chart which illustrates a method according to a further embodiment of the invention;

FIG. 3 illustrates a magnetic resonance imaging system according to an embodiment of the invention;

FIG. 4 illustrates a magnetic resonance imaging system according to a further embodiment of the invention;

FIG. 9 show simulation results using the geometry illustrated in FIGS. 8a, 8b, and 8c;

DETAILED DESCRIPTION OF THE EMBODIMENTS

Figure 5:
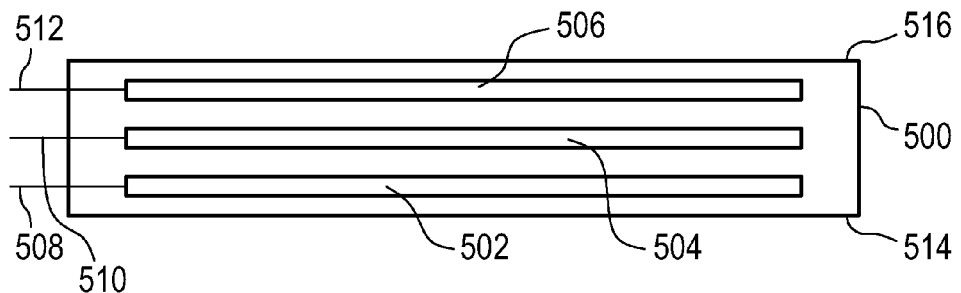
FIG. 5 illustrates an example of a coil assembly according to an embodiment of the invention.

Like numbered elements in these figures are either equivalent elements or perform the same function. Elements which have been discussed previously will not necessarily be discussed in later figures if the function is equivalent.

FIG. 1 shows a flow diagram which illustrates a method according to an embodiment of the invention. In step 100 magnetic resonance data is acquired. In step 102 the radio-frequency shield is switched into the blocking state when eradiating radio-frequency energy by the coil assembly. In step 104 the radio-frequency shield is switched into the transparent state when receiving the radio-frequency energy by the coil assembly. It should be noted that steps 102 and 104 may each be performed multiple times during the acquisition of magnetic resonance data 100.

FIG. 2 shows a flow diagram which illustrates a further embodiment of a method according to the invention. In step 200 magnetic resonance data is acquired. In step 202 the radio-frequency shield is switched into the blocking state when eradiating radio-frequency energy by the coil assembly. In step 204 the radio-frequency shield is switched into the transparent state when receiving the radio-frequency energy by the receiver coil. It should be noted that steps 202 and 204 may be repeated multiple times during the acquisition of the magnetic resonance data 200.

FIG. 3 illustrates an example of a magnetic resonance imaging system 300 according to an embodiment of the invention. The magnetic resonance imaging system 300 comprises a magnet 304. The magnet 304 is a superconducting cylindrical type magnet 304 with a bore 306 through it. The magnet 304 has a liquid helium cooled cryostat with superconducting coils. It is also possible to use permanent or resistive magnets. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 308 where the magnetic field is strong and uniform enough to perform magnetic resonance imaging.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

A subject 318 is reposed on a subject support 320 within the bore 306 of the magnet 304. The subject 318 is partially within the imaging zone 308. In this embodiment a coil assembly 314 is shown as being within the imaging zone 308. In other embodiments the coil assembly could be outside of the imaging zone 308 facing towards the imaging zone.

There is a first surface 315 of the coil assembly 314 which is directed towards the imaging zone 308. The coil assembly 314 comprises one or more coil elements 317 and two conductive elements 322 which are connected by a radio-frequency switch 324. The combination of the conductive elements 322 and the radio-frequency switch 324 form a radio-frequency shield. The coil elements 317 are connected to the transceiver 316. There is a radio-frequency shield controller 325 which is configured for switching the one or more radio-frequency switches 324. The coil element 317 may represent multiple coil elements each of which may be driven independently by the transceiver 316. Likewise the two conductive elements 322 may represent more than two conductive elements. The radio-frequency switch 324 is also intended to possibly represent multiple radio-frequency switches. The magnetic field gradient coil power supply 312, the transceiver 316, and the radio-frequency shield controller 325 are all connected to a hardware interface 328 of a computer system 326. The computer system 326 further comprises a processor 330. The processor 330 is connected to the hardware interface 328, a user interface 332, computer storage 336, and computer memory 338. The processor is configured to control the operation and function of the magnetic resonance imaging system using the hardware interface 328.

The computer storage 336 is shown as containing a pulse sequence 340. A pulse sequence as used herein comprises a set of instructions which may be used for temporarily controlling the magnetic resonance imaging system 300 to acquire magnetic resonance data 342. The computer storage 336 is further shown as containing magnetic resonance data 342 acquired using the pulse sequence 340. The pulse sequence 340 in some embodiments may be a sensitivity encoding pulse sequence or SENSE pulse sequence. The computer storage 336 is further shown as containing a magnetic resonance image 344 that has been reconstructed from the magnetic resonance data 342. The computer memory 338 is further shown as containing a control module 350. The control module 350 comprises computer executable code for controlling the operation and function of the magnetic resonance imaging system 300. It may for instance use the pulse sequence 340 to generate commands to control the magnetic resonance imaging system 300 to acquire the magnetic resonance data 342. The computer memory 338 is further shown as containing an image reconstruction module 352 for reconstructing the magnetic resonance image 344 from the magnetic resonance data 342.

FIG. 4 illustrates a magnetic resonance imaging system 400 according to a further embodiment of the invention. The magnetic resonance imaging system 400 shown in FIG. 4 is similar to the magnetic resonance imaging system 300 of FIG. 3. In this example the coil assembly 314 is constructed slightly differently. The coil assembly is shown as having multiple coil elements 317. These coil elements 317 are connected to a transmitter 416. The coil elements 317 are therefore adapted for irradiating or transmitting radio-frequency energy. In some embodiments, the transmitter has multiple channels for supplying each of the coil elements 317 with radio-frequency energy separately. Each of the multiple channels may have an individually controllable amplitude and/or phase and/or frequency and/or waveform and/or pulse shape. Alternatively, each coil element 317 may also be able to be connected to an individual transmitter. Each of the transmitters may have an individually controllable amplitude and/or phase and/or frequency and/or waveform and/or pulse shape. In another embodiment there is only one transmitter and a power combiner distributes the RF energy to the individual coil elements.

The radio-frequency shield 319 is shown as also comprising three conductive elements 322 which are connected by radio-frequency switches 324. Again each of the multiple coil elements 317 may each represent multiple coil elements and the conductive elements 322 may also represent further or more conductive elements. Likewise the radio-frequency switch 324 may each represent multiple radio-frequency switches. Mounted in the bore 306 of the magnet 304 is a receiver coil 420. The receiver coil 420 is connected to a receiver 418. The transmitter 416 and the receiver 418 are both connected to the hardware interface 328. When the transmitter 416 is transmitting using the coil elements 317 the switches 324 are closed and the conductive elements 322 are connected. When the receiver 418 is receiving using the receiver coil 420 the switches 324 are open and the radio-frequency shield 319 is in the transparent state. Receiver coil 420 may for instance be a body or whole body coil.

FIG. 5 illustrates an example of a coil assembly 500 according to an embodiment of the invention. The outer surface of the coil assembly 500 has a first surface 514 and a second surface 516. Within the coil assembly 500 there is a set of receiver coil elements 502. Individual coil elements are now shown. In this embodiment there is further a set of transmitter coil elements 504. The individual transmitter coil elements are not shown. The receiver coil elements 502 are between the transmitter coil elements and the first surface 514. In this embodiment there is further shown a radio-frequency shield 506 that can be switched between a blocking state and a transparent state. The individual radio-frequency switches and conductive elements comprising the radio-frequency shield 506 are not shown. The transmitter coil elements 504 are between the radio-frequency shield 506 and the receiver coil elements 502. The receiver coil elements 502 are shown as being connected to a connection to a receiver 508. The transmitter coil elements 504 are shown as being connected to a connection to a transmitter 510. The radio-frequency shield 506 is shown as being connected to a connection to a radio-frequency shield controller 512.

Figure 6:
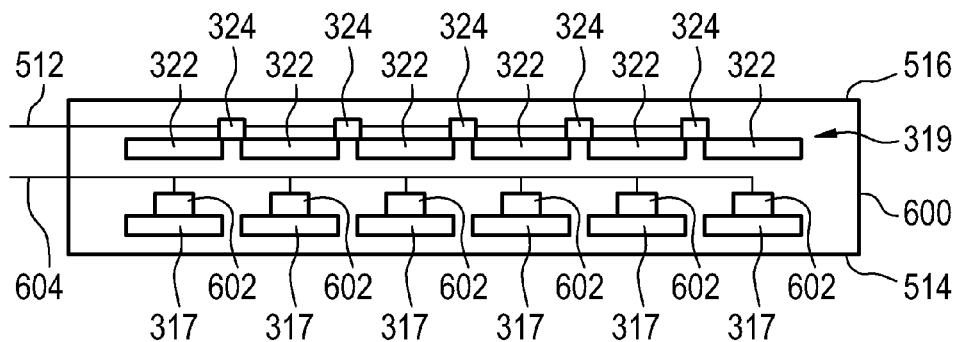
FIG. 6 shows a further embodiment of a coil assembly according to an embodiment of the invention.

FIG. 6 shows a further embodiment of a coil assembly 600 according to an embodiment of the invention. Again this coil assembly has a first surface 514 and a second surface 516. The first surface is intended to be directed towards an imaging zone of a magnetic resonance imaging system. Within the coil assembly 600 there is a collection of coil elements 317. Each of the coil elements 317 is connected to its own individual matching network element 602. The matching network element 602 is connected to a connection to a transceiver 604. Alternatively they may each be connected to a transmitter or receiver also. There may be a separate connection from each matching network element 602 to the transceiver, transmitter, or receiver. Also within the coil assembly 600 there is a collection of conductive elements 322 connected by multiple radio-frequency switches 324. The radio-frequency switches 324 are connected to a connection to a radio-frequency shield controller 512. The coil elements 317 are between the first surface and the conductive elements 322.

Figure 7:
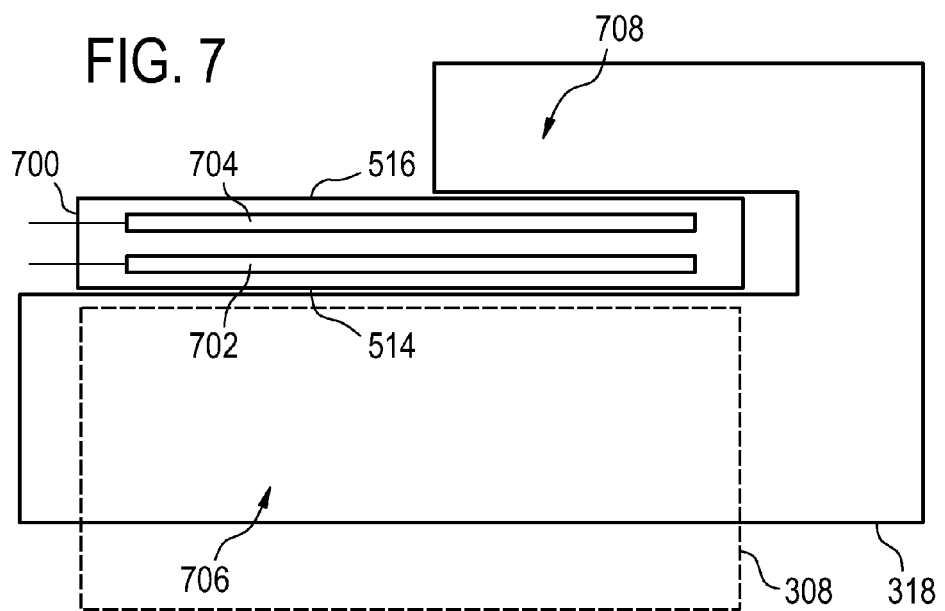
FIG. 7 illustrates how the radio-frequency shield can be used to shield a portion of the subject from radio-frequency energy generated by the coil elements.

FIG. 7 illustrates how the radio-frequency shield 704 can be used to shield a portion of the subject 708 from radio-frequency energy generated by the coil elements 702. In this Fig. there is a coil assembly 700. It has a first surface 514 directed towards an imaging zone 308 of a magnetic resonance imaging system. It has a second surface 516 directed away from the imaging zone 308. There is a subject 318 partially within the imaging zone 706. In the coil assembly 700 there are one or more coil elements 702 that are between the first surface 514 and the radio-frequency shield 704. The individual conductive elements and switches of the radio-frequency shield 704 are not illustrated in this example. The region of the subject 706 may be imaged in the magnetic resonance imaging system. The region 708 of the subject 318 is shielded by the radio-frequency shield 704 from the coil elements 702.

Figure 8A:
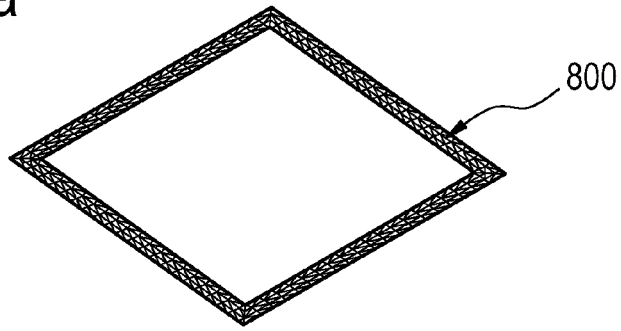
FIGS. 8A, 8B, and 8C illustrate a geometry of a radio frequency shield used for a simulation.
Figure 8B:
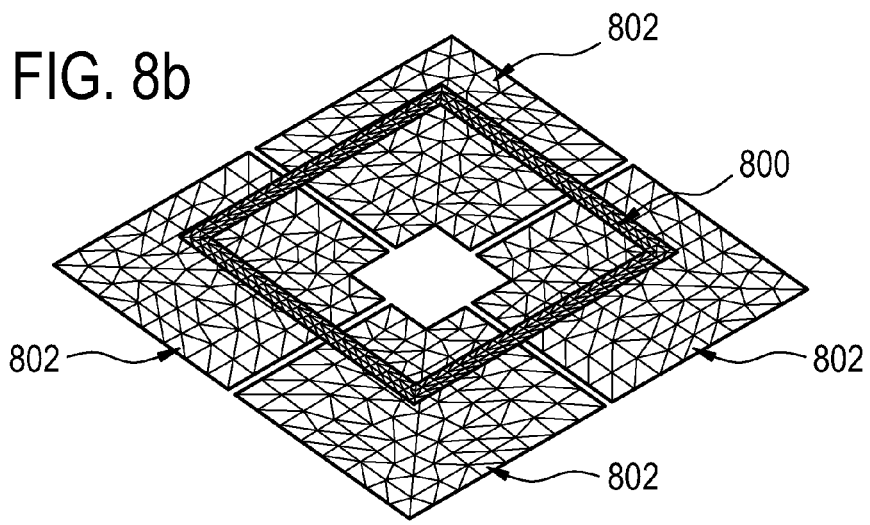
Figure 8C:
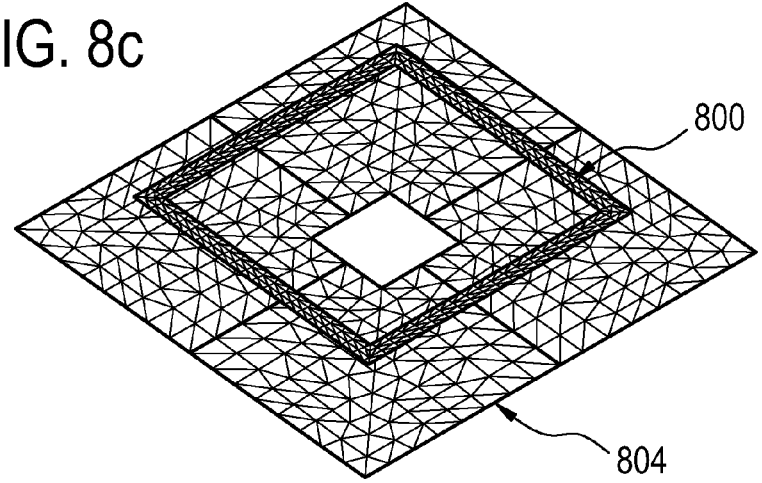

FIGS. 8a, 8b, and 8c illustrate a geometry for a simulation. There is a single loop coil 800 which functions as the coil element. This is shown in FIGS. 8a, 8b and 8c. FIG. 8b also shows four conductive elements 802. The radio-frequency screen is in the open or in transparent mode. Finally in 8c the four conductive elements 802 are connected together to make a radio-frequency shield 804 that is in the blocking state.

Embodiments of the invention can easily be realized using common PCB-based coil technology. The coil element itself remains unchanged besides the proper tuning compared to the case of no RF-screen present. The RF-screen is introduced using typical coil material as well, e.g. copper coated low loss PCB-substrate like FR4. The screen is structured e.g. as is shown in FIG. 8: the slots between the segments in this realization are to be bridged with one or more PIN-diodes in a suitable fashion. The diodes are forward biased during transmit shortening the slots and thus forming one RF-screen from the different patches. During receive mode the PIN-diodes are reverse biased isolating the patches from one another. Size and number of patches necessary for a given frequency and coil geometry have to be adapted on case by case basis.

In an alternative embodiment to that shown in FIGS. 8a, 8b, and 8c, the slots in the RF-screen are equipped with lumped capacitances of a predetermined value that are switched active with PIN-diodes. Doing so results in a resonant RF-screen. The resonance frequency of the screen may be shifted using tunable caps e.g. varactors or preset fixed values. This setup allows for adjusting the amount of coupling between RF-screen and coil element and via this adjustment the behavior of the B1- and E-fields. In FIGS. 8a, 8b, and 8c the local electrical field in a representative triangle 10 mm above a capacitor for the surface coil (no dielectric) with and without a RF shield related to the same B1 at a distance of 100 mm from the coil was calculated using the geometry shown in FIG. 8. The RF current increases from 469 A/m to 1237 A/m, which corresponds to a factor of 2.638. The electrical field increases 10 mm above a capacitor from 3.98 kV/m to 6.54 kV/m, thus the increase is only a factor of 1.64. The results are shown in FIGS. 9 and 10.

Figure 10:
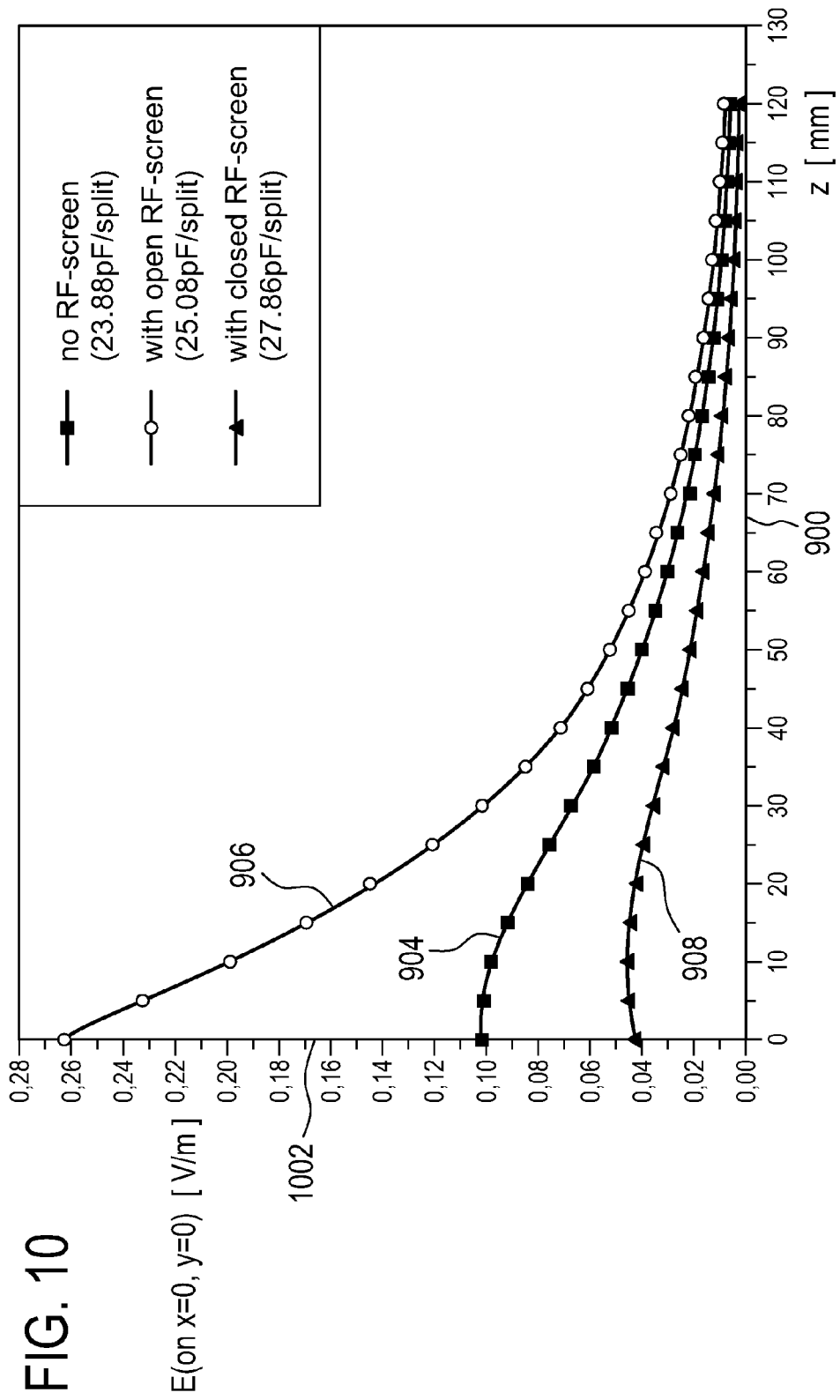
FIG. 10 show simulation results using the geometry illustrated in FIGS. 8a, 8b, and 8c.

FIGS. 9 and 10 show simulation results using the geometry illustrated in FIGS. 8a, 8b, and 8c. In FIG. 9 the magnetic field component 902 is shown as a function of distance 900 for three cases with no radio-frequency screen 904, with the open or transparent radio-frequency screen 906, and with the closed or blocking radio-frequency screen 908.

In FIG. 9 plots the magnitude of the H-field on the z-axis for the three different scenarios for equal excitation power of 1 W. FIG. 9 demonstrates, that the slitted RF-shield does not significantly suppress the magnitude of the H-field achievable. The opened RF-shield would be used during reception. FIG. 10 shows the corresponding E-field along the z-axis. During transmission, the RF-shield would be closed e.g. using PIN-diodes significantly reducing E-fields. The RF-screen is located 20 mm below the coil, the central opening (c.f. FIG. 8 is 20×20 mm).

Figure 11:
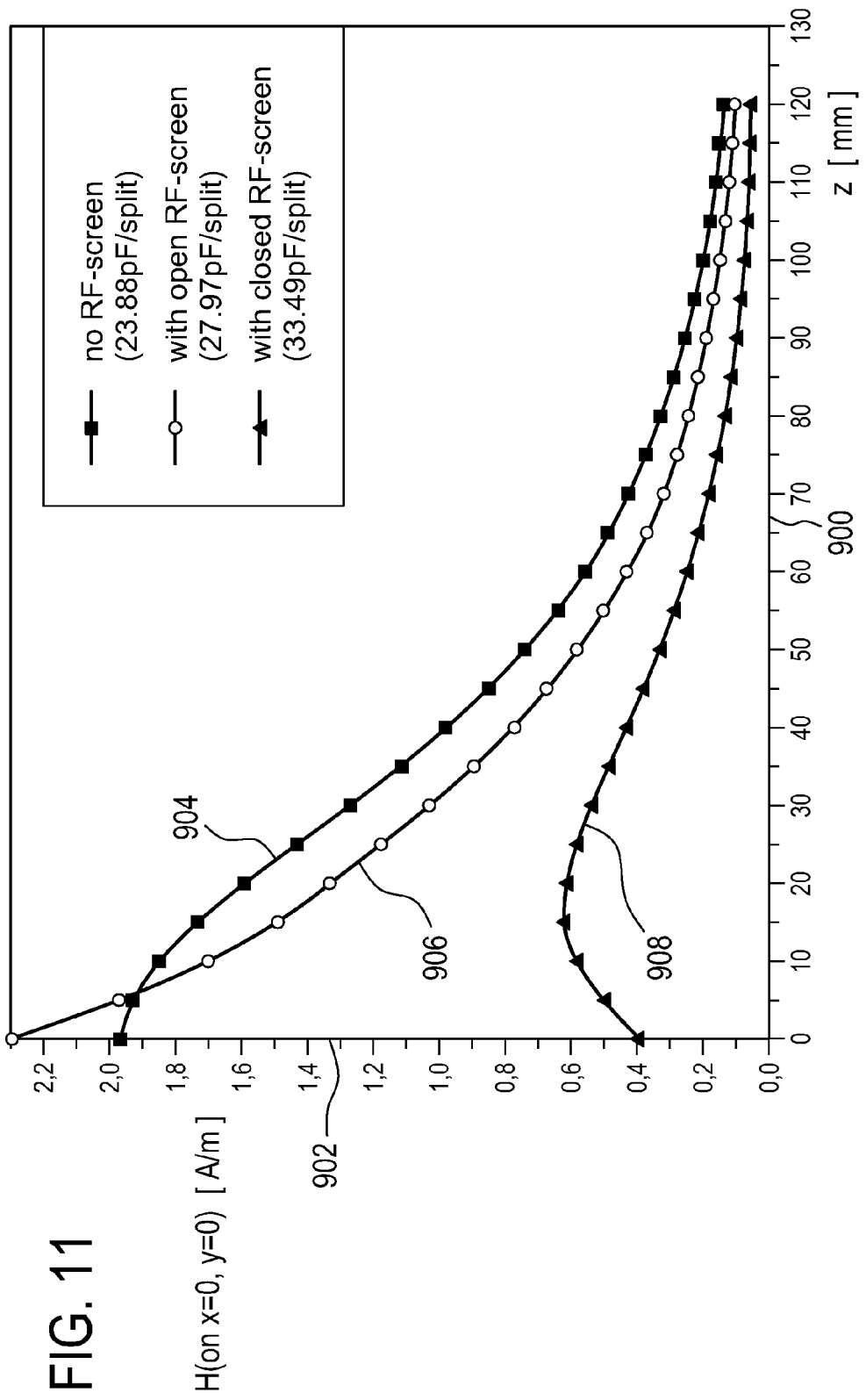
FIG. 11 show simulation results for simulation using a modification of the geometry illustrated in FIGS. 8a, 8b, and 8c.
Figure 12:
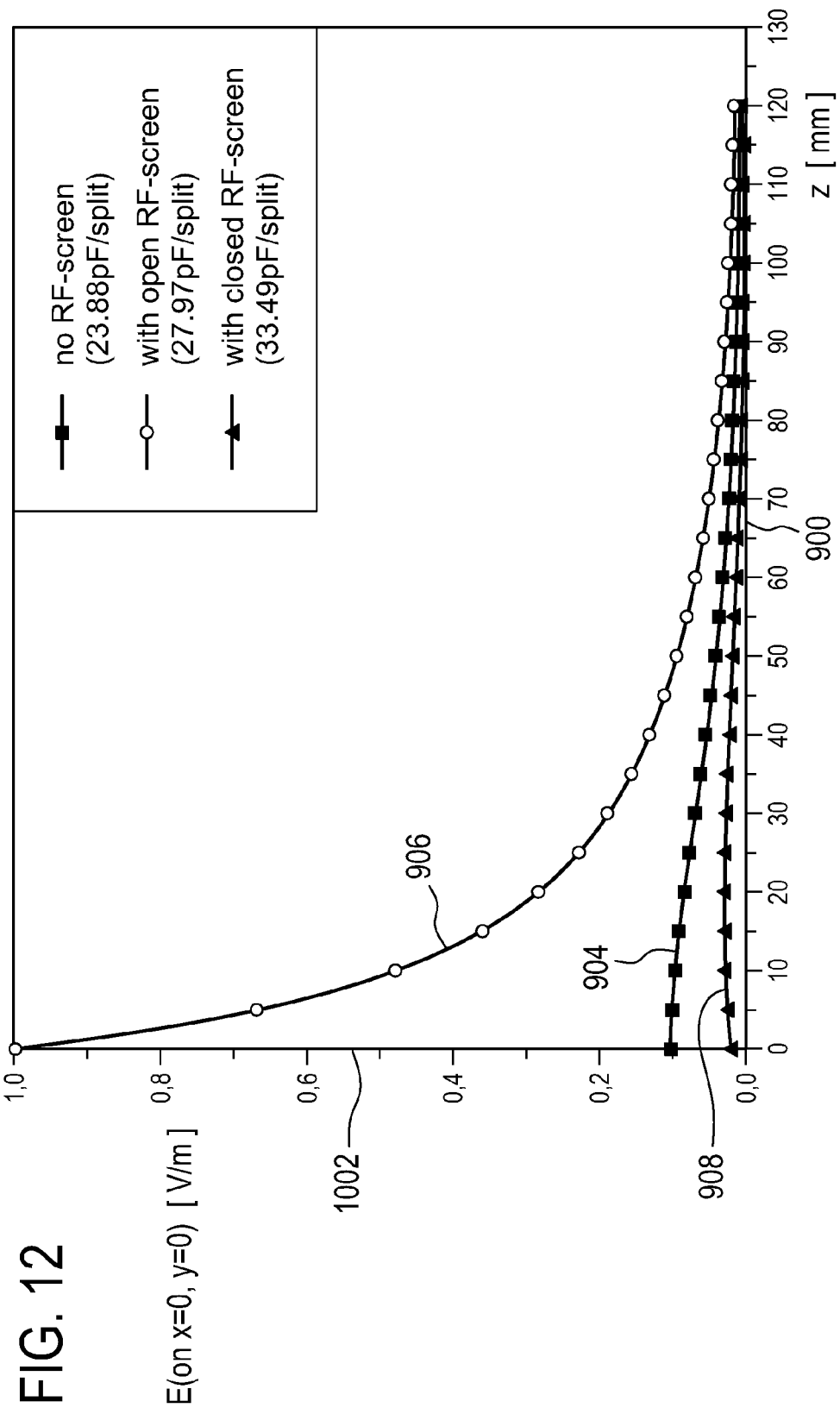
FIG. 12 show simulation results for simulation using a modification of the geometry illustrated in FIGS. 8a, 8b, and 8c.

FIGS. 11 and 12 show results similar to those shown in FIGS. 9 and 10 except for the simulation distance to the radio-frequency screen was reduced to 10 mm and the radio-frequency screen was completely closed not containing a hole in the center as is shown in FIGS. 8b and 8c. The reduction in the electric field for the transmitting state is even better than in comparison to the results shown in FIGS. 9 and 10.

In FIGS. 11 and 12, results from simulations as in FIGS. 9 and 10 with different geometry are shown. The distance to the RF-screen was reduced to 10 mm and the RF-screen was completely closed, not containing the hole in the center (cf. FIG. 8). The reduction in E-field for Tx is even better compared to FIGS. 9 and 10.

Figure 13:
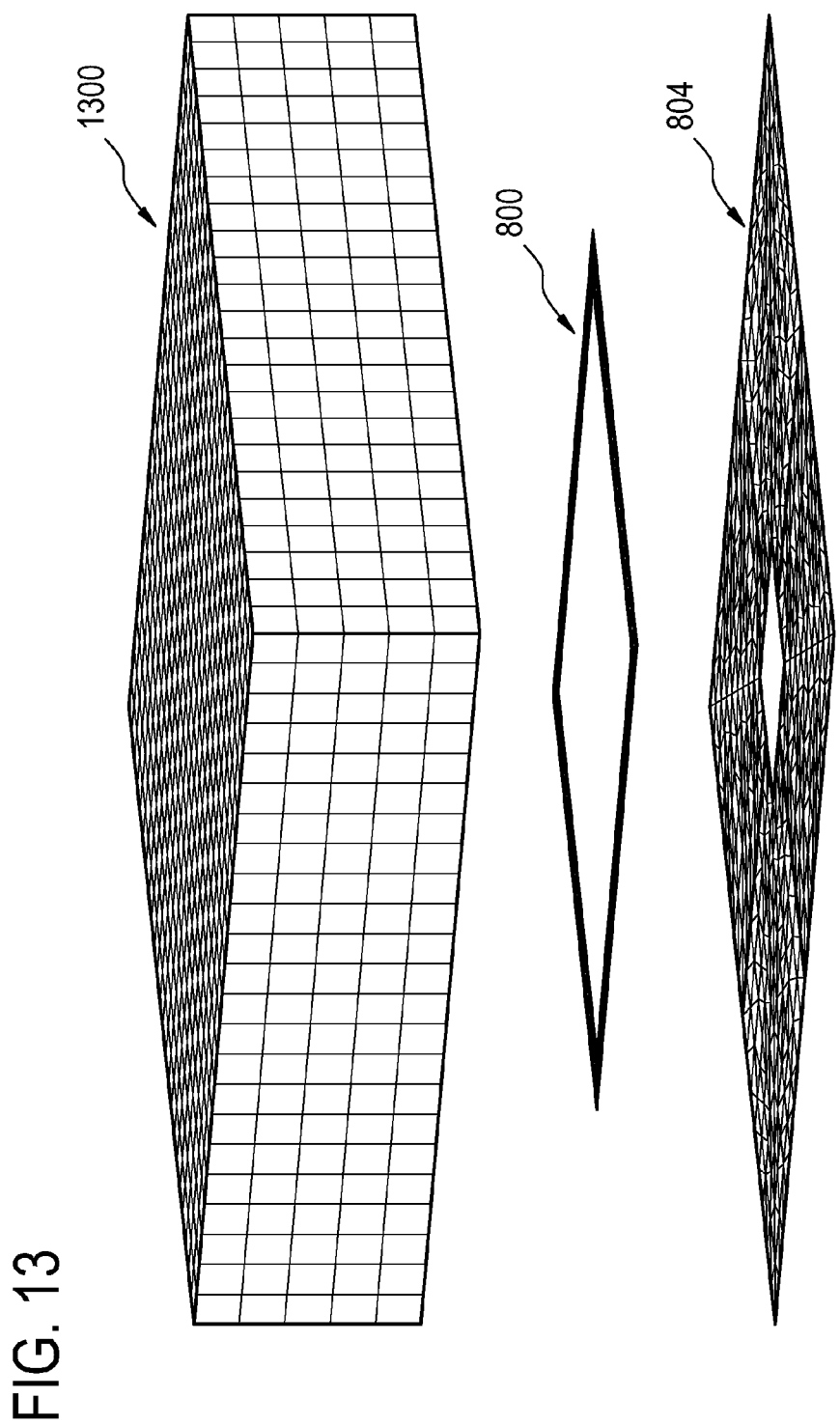
FIG. 13 illustrate an alternative geometry of a radio frequency shield used for a simulation.

FIG. 13 shows a different simulation geometry. The geometry shown in FIGS. 8a, b and c is used again except in this case the coil 800 and the switchable radio-frequency screen 804 are loaded with a dielectric body 1300. The coil 800 is located adjacent to the dielectric body 1300. The dielectric body 1300 is to simulate the effect of human tissue located 10 mm about the radio-frequency coil.

Figure 14:
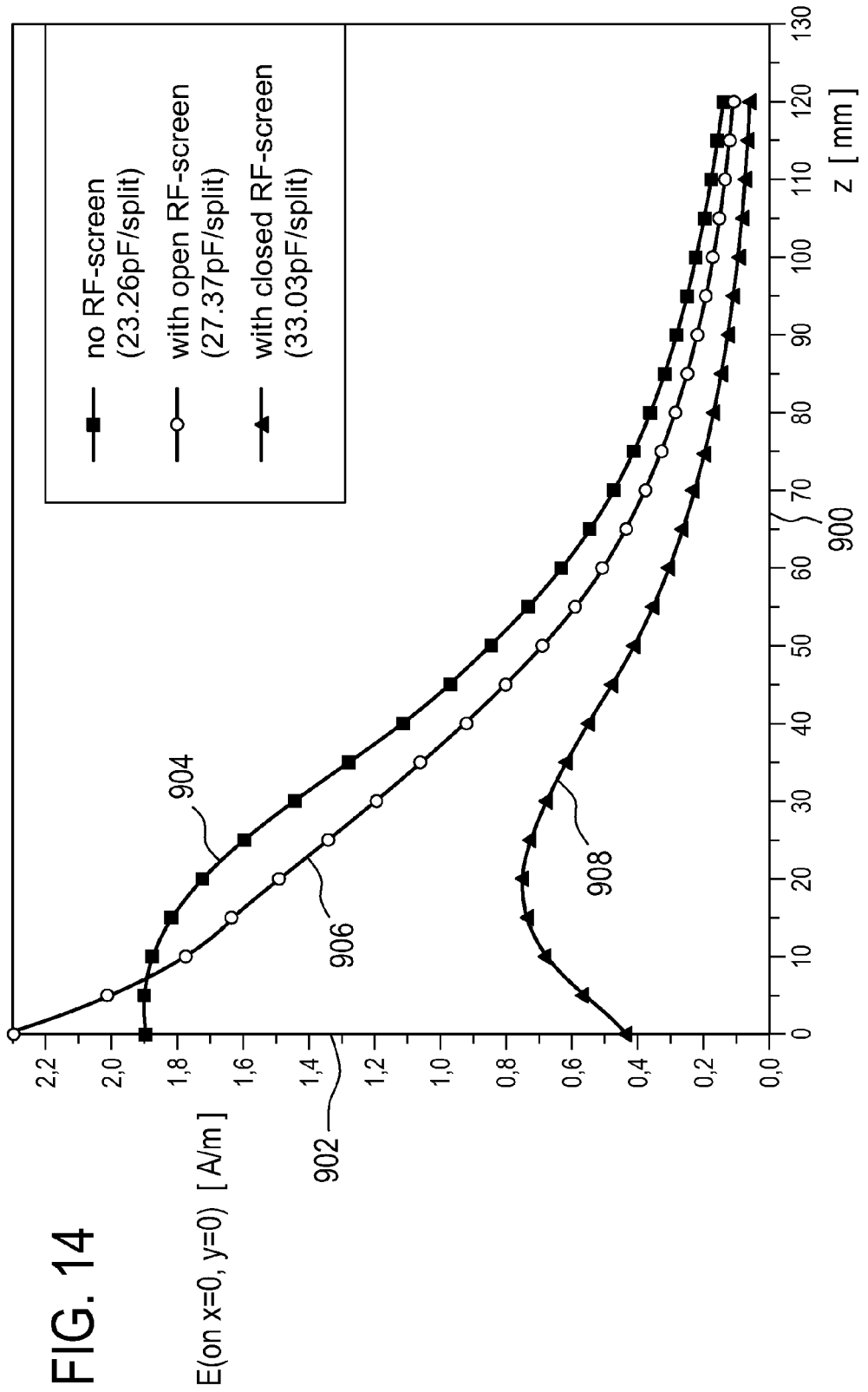
FIG. 14 show simulation results using the geometry illustrated in FIG. 13.
Figure 15:
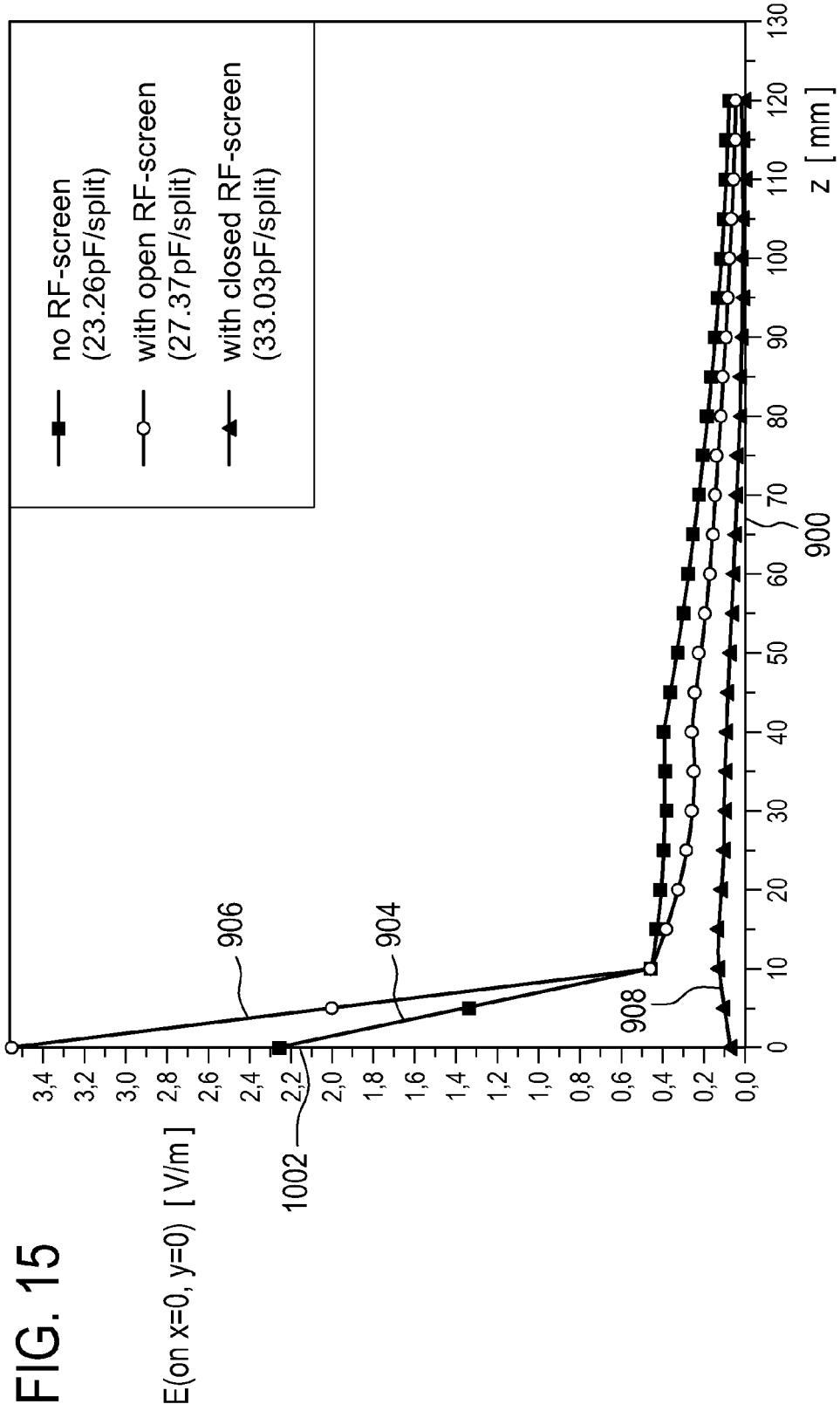
FIG. 15 show simulation results using the geometry illustrated in FIG. 13.

FIGS. 14 and 15 are analogous to FIGS. 9 and 10 except the simulation geometry of FIG. 13 is used instead of the simulation geometry of FIGS. 8a, 8b, and 8c. These results show simulations as described above with a isotropic dielectric having properties of human tissue located 10 mm above the RF-coil. The reduction of E-fields close to the coil during transmission is significantly reduced while the required power for equal magnetic field is doubled.

Figure 16:
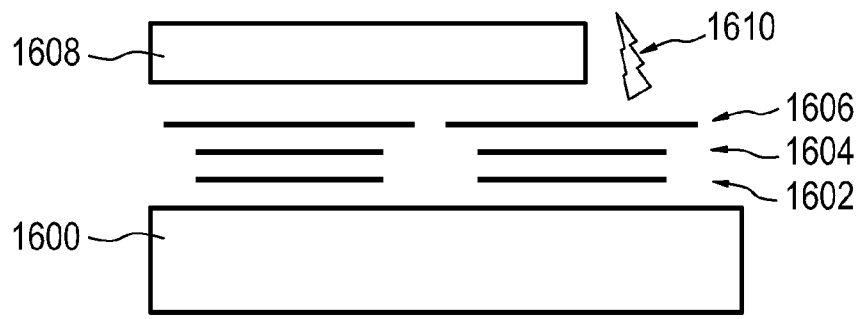
FIG. 16 illustrates how an embodiment of the invention may be used to protect a portion of a subject.

FIG. 16 illustrates how an embodiment of the invention may be used to protect a portion of a subject 1608. In this Fig. a subject 1600 is shown, the subject 1600 is adjacent to a receive coil segment 602. The receive coil segment 602 is between the subject and a transmit coil segment 1604. On the opposite side of the transmit coil segment 1604 from the receive coil segment 1602 is located a switchable radio-frequency screen 1606. The switchable radio-frequency screen 1606 is located between a portion of the subject 1608 and the transmit coil segment 1604. When the switchable radio-frequency screen 1606 is switched into the closed or blocking state radiation 1610 from the transmit coil segment 1604 is blocked from reaching the shielded portion of the subject 1608.

In the embodiment shown in FIG. 16 different coil elements are used for Transmit (Tx) and Receive (Rx). While the Tx only coil 1604 is located close to the screen (as described above) the Rx only is located closer to the subject to be imaged (and thus farther from the RF-screen). This results in improved Rx sensitivities but on the cost of a thicker batch of coils/screen.

Figure 17:
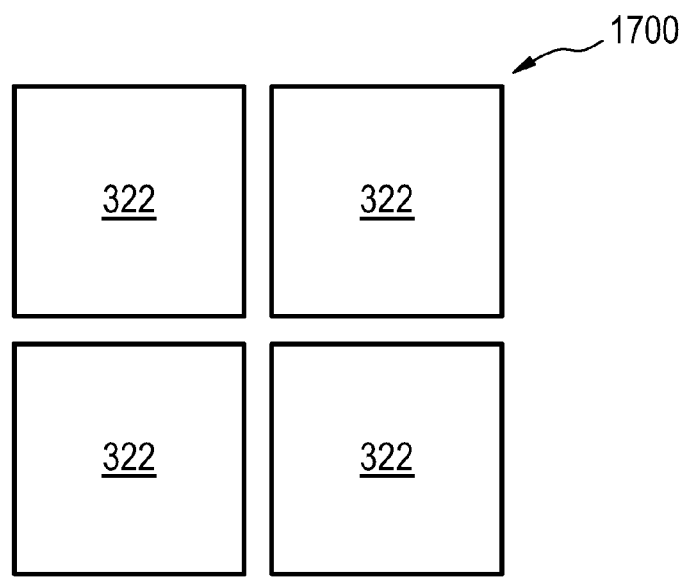
FIG. 17 shows a possible geometry of a radio-frequency shield according to an embodiment of the invention.

FIG. 17 shows a possible geometry of a radio-frequency shield 1700 according to an embodiment of the invention. In this embodiment there are four square conductive elements 322 arranged next to each other.

Figure 18:
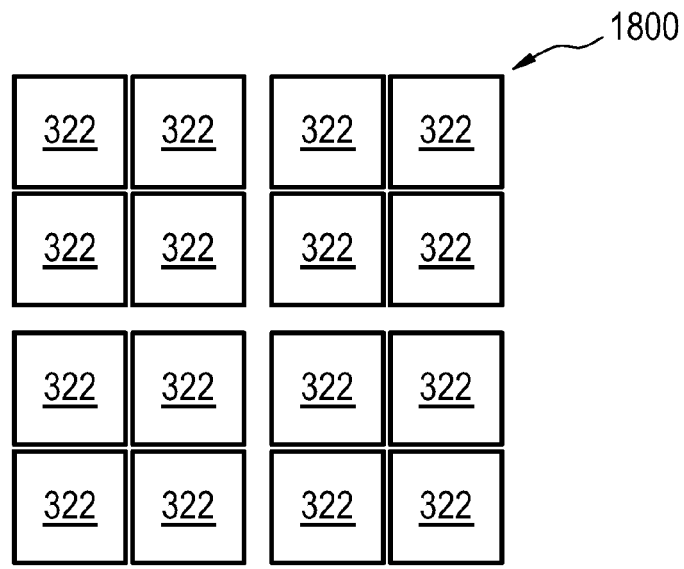
FIG. 18 shows a possible geometry of a radio-frequency shield according to a further embodiment of the invention.

FIG. 18 shows an alternative arrangement of the conductive elements 322. In this Fig. a radio-frequency shield 1800 is formed by 16 square conductive elements 322.

Figure 19:
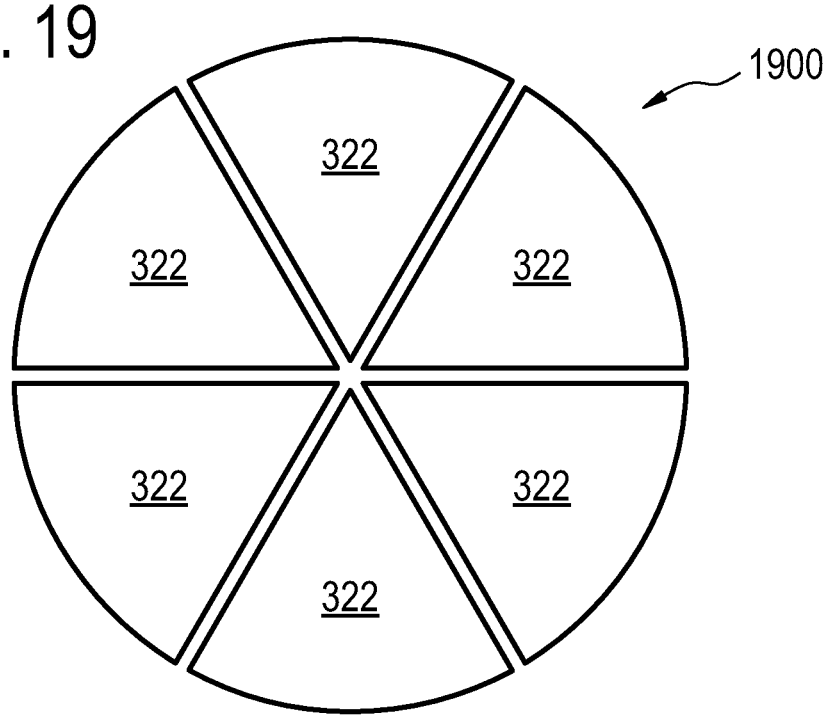
FIG. 19 shows a possible geometry of a radio-frequency shield according to a further embodiment of the invention.

FIG. 19 shows a radio-frequency shield 1900 according to a further embodiment of the invention. In this embodiment the radio-frequency shield is circular-shaped and is comprised of pie-shaped conductive elements 322.

Figure 20:
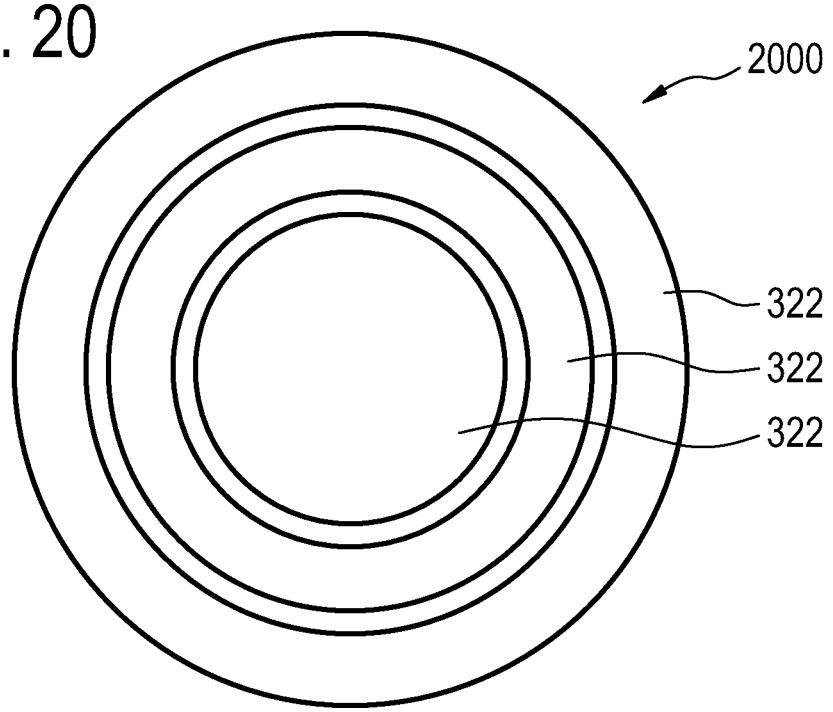
FIG. 20 shows a possible geometry of a radio-frequency shield according to a further embodiment of the invention.

FIG. 20 shows an alternative embodiment of a radio-frequency shield 2000 according to an embodiment of the invention. In this embodiment the conductive elements 322 are arranged in a target-shape.

Examples shown in FIGS. 17, 18, 19, and 20 are only several possible designs for a structured radio-frequency screen depending on the desired influence on the radio-frequency coil located above such a screen. Irregular shapes are also possible and may be desirable for certain applications.

Figure 21:
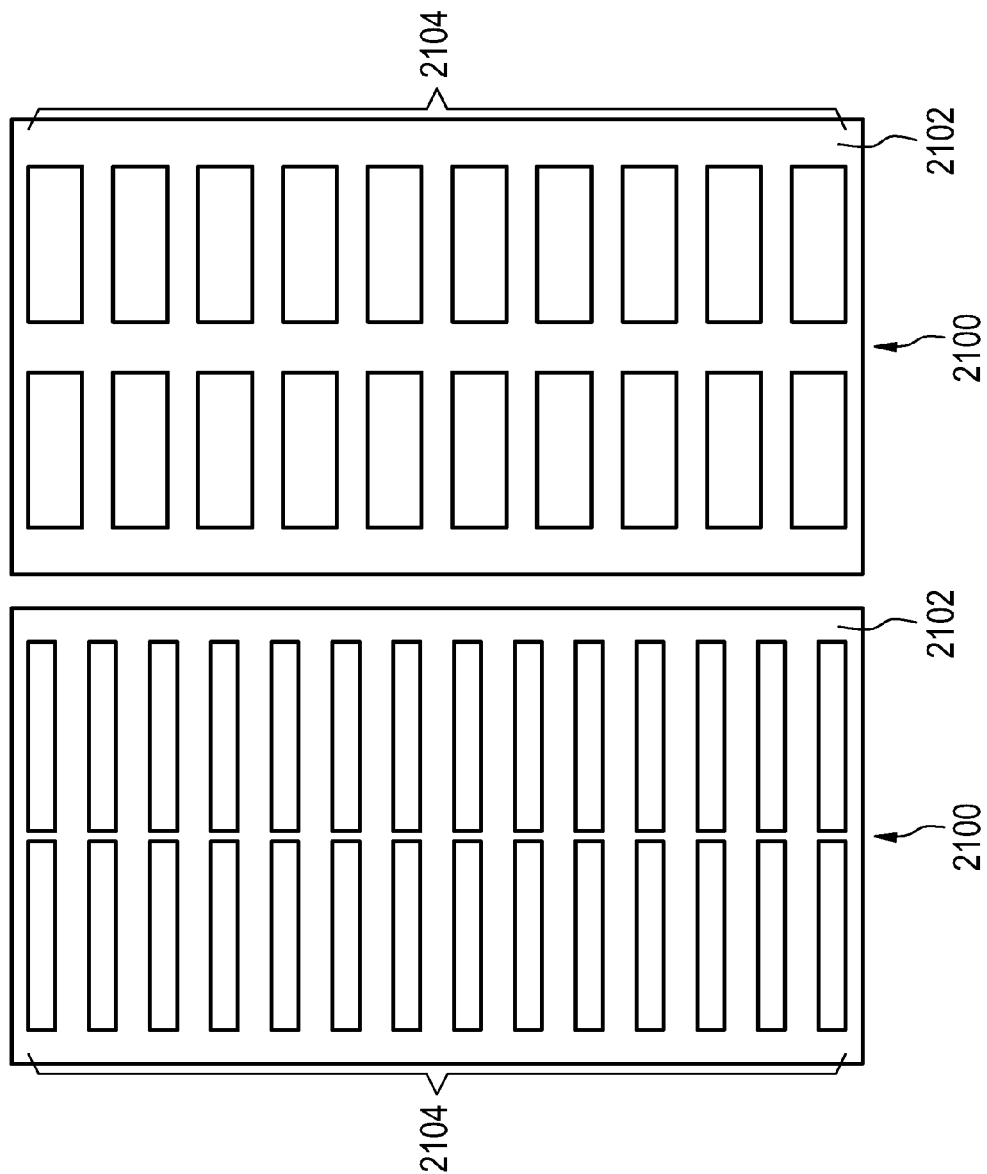
FIG. 21 illustrates how the radio-frequency shield could be constructed using patterned printed circuit board.

FIG. 21 illustrates how the radio-frequency shield could be constructed using patterned printed circuit board 2100. Two pieces of patterned printed circuit board 21 are shown. Each one consists of a low loss substrate 2102. Attached to the low loss substrate 2102 on each board 2100 is patterned copper 2104. Such copper strips 2104 could be used for constructing the antenna elements and/or the conductive elements for the coil assembly.

Figure 22:
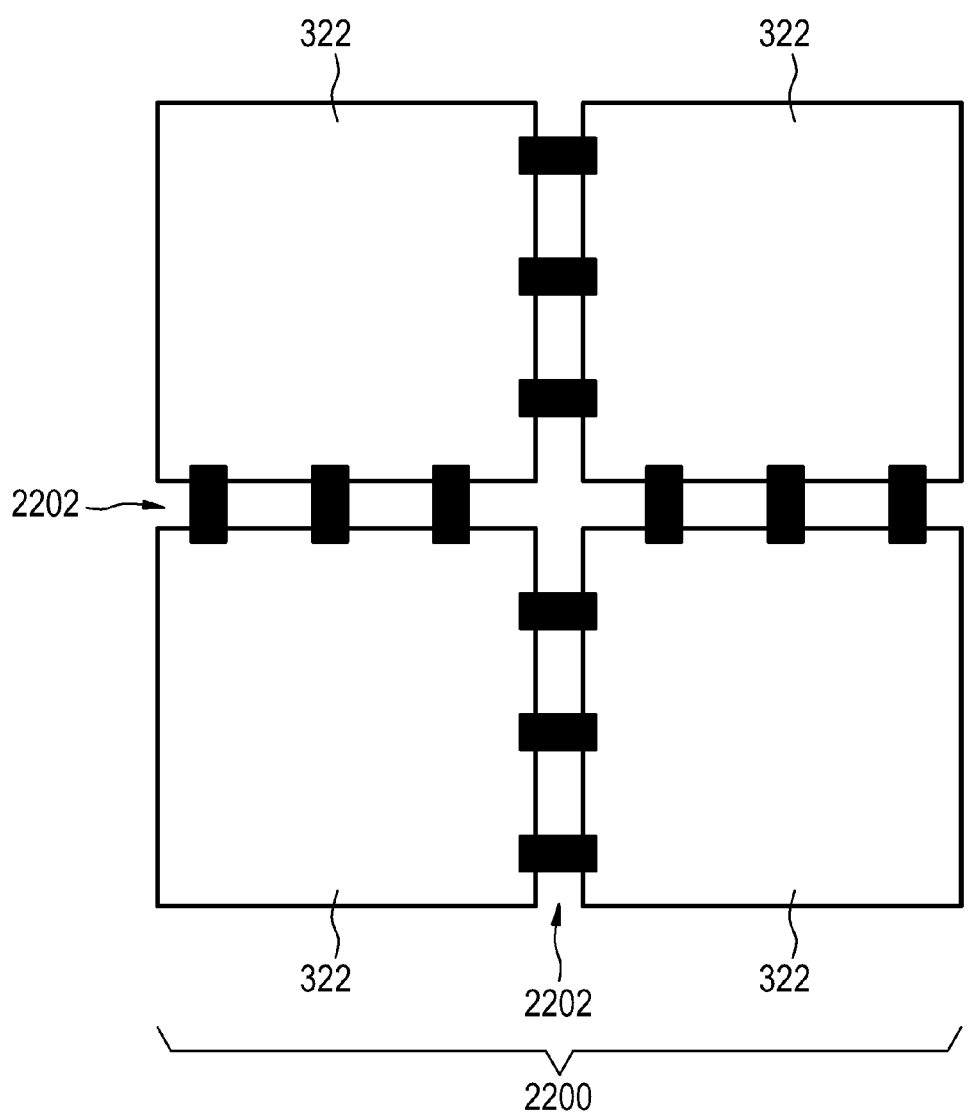
FIG. 22 shows an alternative embodiment of a radio-frequency shield 2200 according to an embodiment of the invention.

FIG. 22 shows an alternative embodiment of a radio-frequency shield 2200 according to an embodiment of the invention. In this example there are four conductive elements 322. The conductive elements are connected together with rows of pin diodes 2202. The pin diodes 2202 function as the radio-frequency switches. This example could be constructed using a printed circuit board with example pin diodes for switching on and off. In some embodiments the switches may be replaced by or accompanied by lumped components like capacitors for further expanding the tuning possibilities of the radio-frequency shield 2200.

Figure 23:
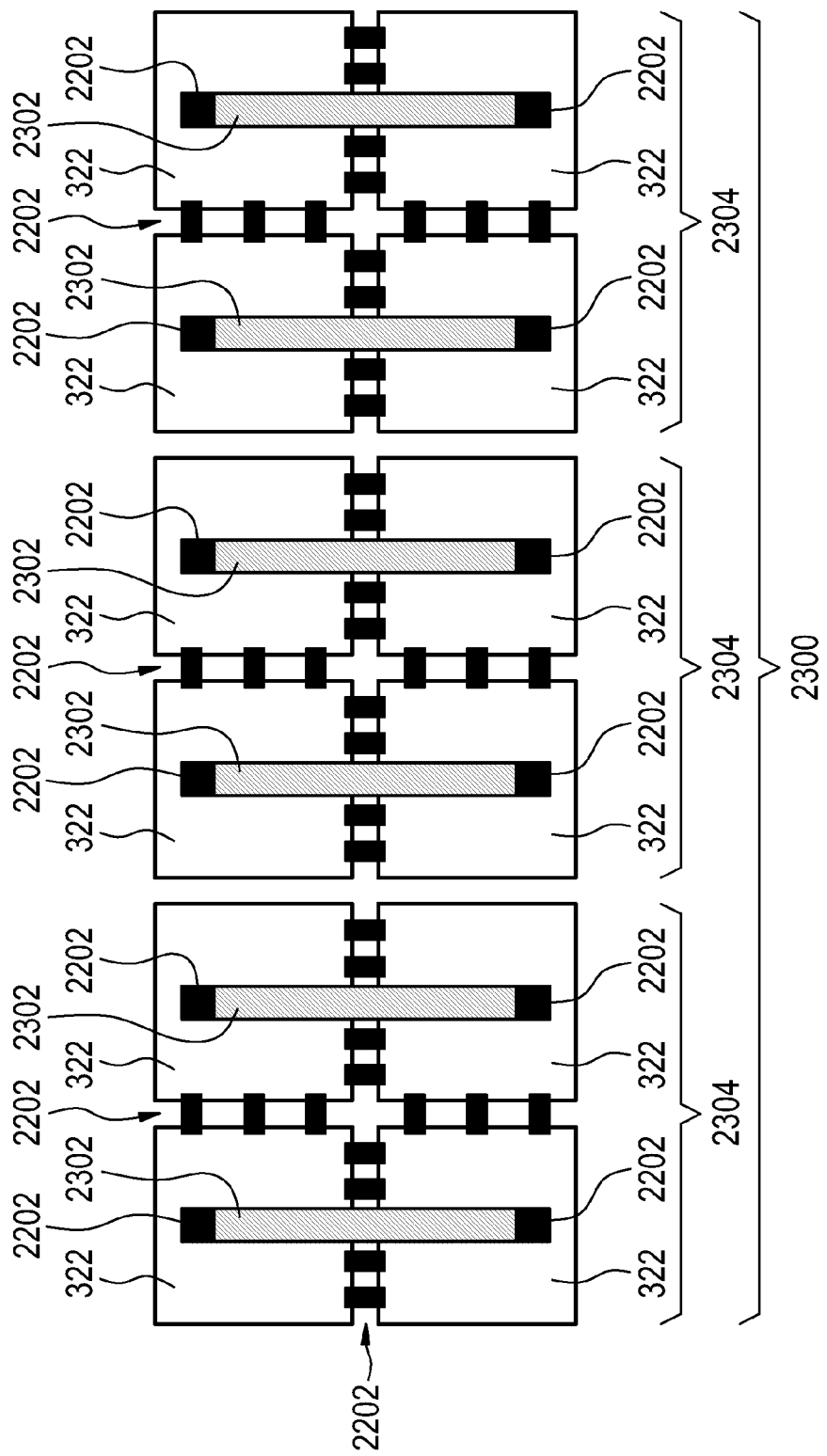
FIG. 23 illustrates a coil assembly according to an embodiment of the invention.

FIG. 23 illustrates a coil assembly 2200 according to an embodiment of the invention. This coil assembly has three separate radio-frequency shields 2304. Each of the separate radio-frequency shields 2304 is comprised of four conductive elements 322 that are connected by pin diodes 2202. For each of the separate radio-frequency shields 2304 there is a TEM transmit coil 2302. The TEM transmit coils are not decoupled and have separate switchable radio-frequency screens 2304. During transmit the coils are connected with the screen and the transmit coil is resonant. During reception a separate loop coil is located below the screen which is not shown. In case of geometrical decoupling of the coils, for example via overlap a suitable screen design would be more evolved. The TEM transmit coils are connected to the screen via pin diodes 2202.

Figure 24:
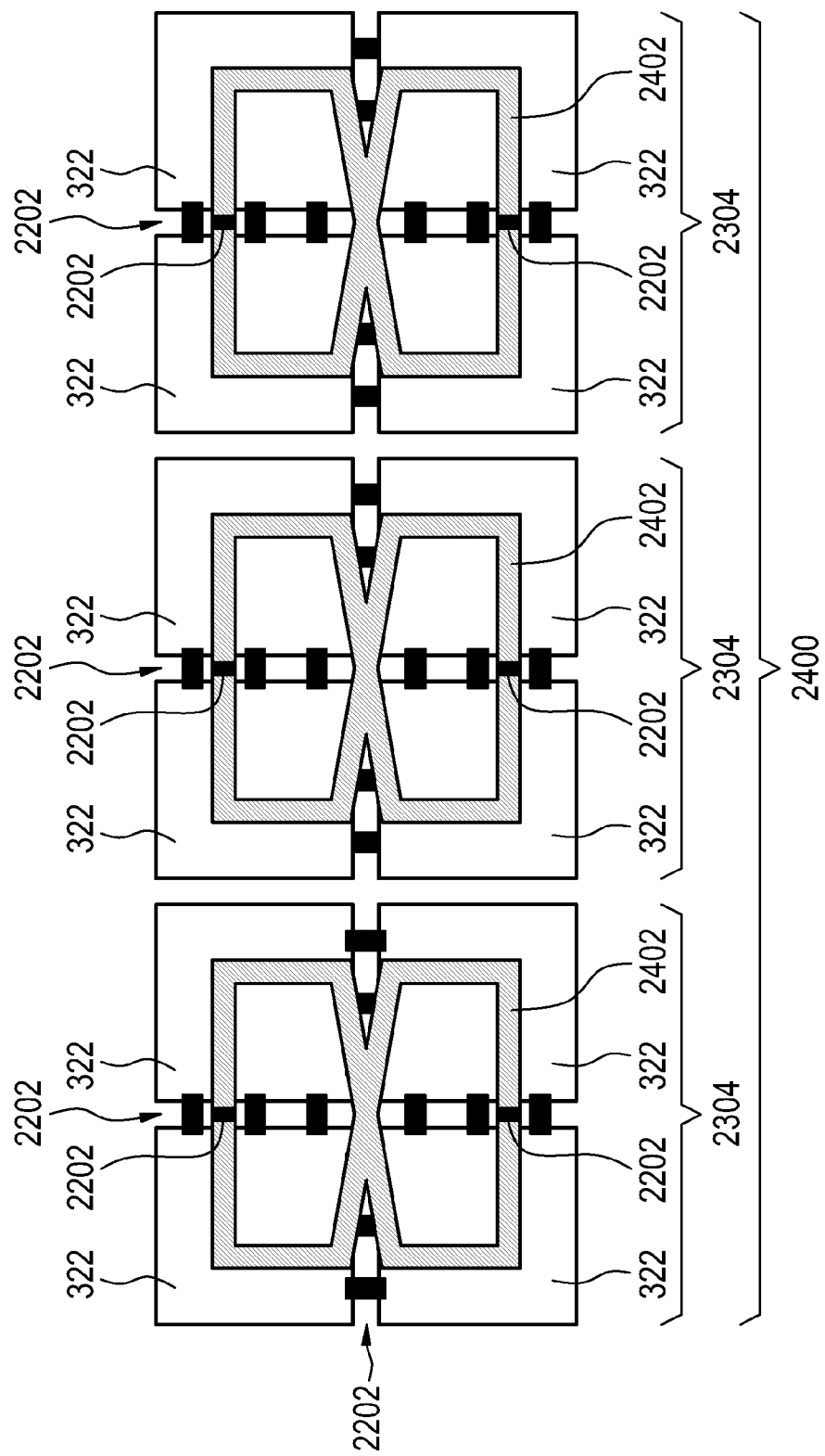
FIG. 24 illustrates a coil assembly according to a further embodiment of the invention.

FIG. 24 shows another embodiment of a coil assembly 2400 according to an embodiment of the invention. The embodiment shown in FIG. 24 is very similar to that shown in FIG. 23 except that butterfly coils 2402 are used instead of the TEM transmit coils. The butterfly coils 2402 are split with pin diodes 2202. When the butterfly coils 2402 are used for transmitting or receiving the pin diodes are used to connect the two sections of the butterfly coils 2402.

Figure 25:
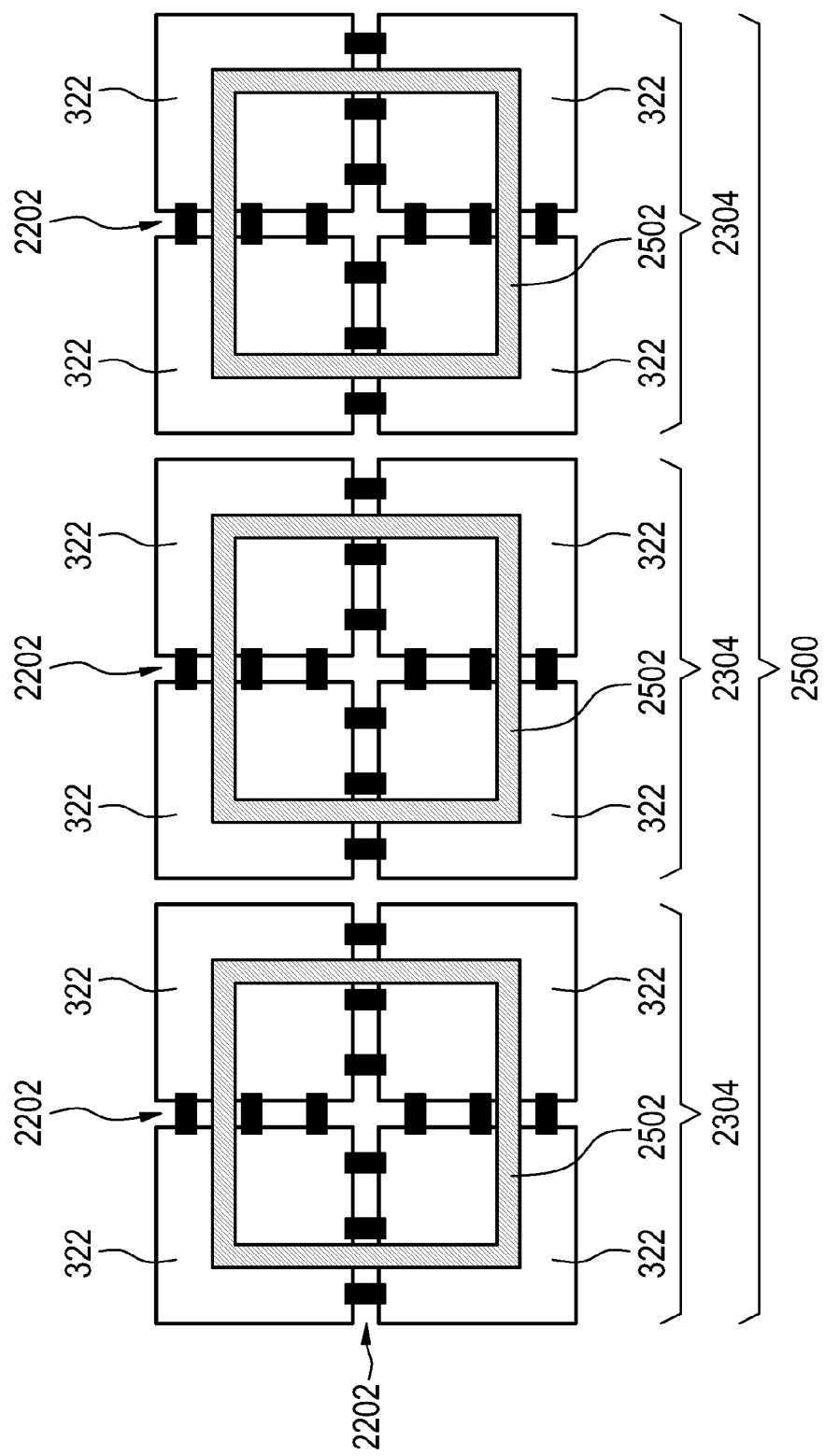
FIG. 25 illustrates a coil assembly according to a further embodiment of the invention.

FIG. 25 shows an alternative embodiment of a coil assembly 2500 according to the invention. The example of FIG. 25 is similar to that in FIGS. 24 and 23. However, in this case the TEM coil or butterfly coil has been replaced with a loop coil 2502.

Figure 26:
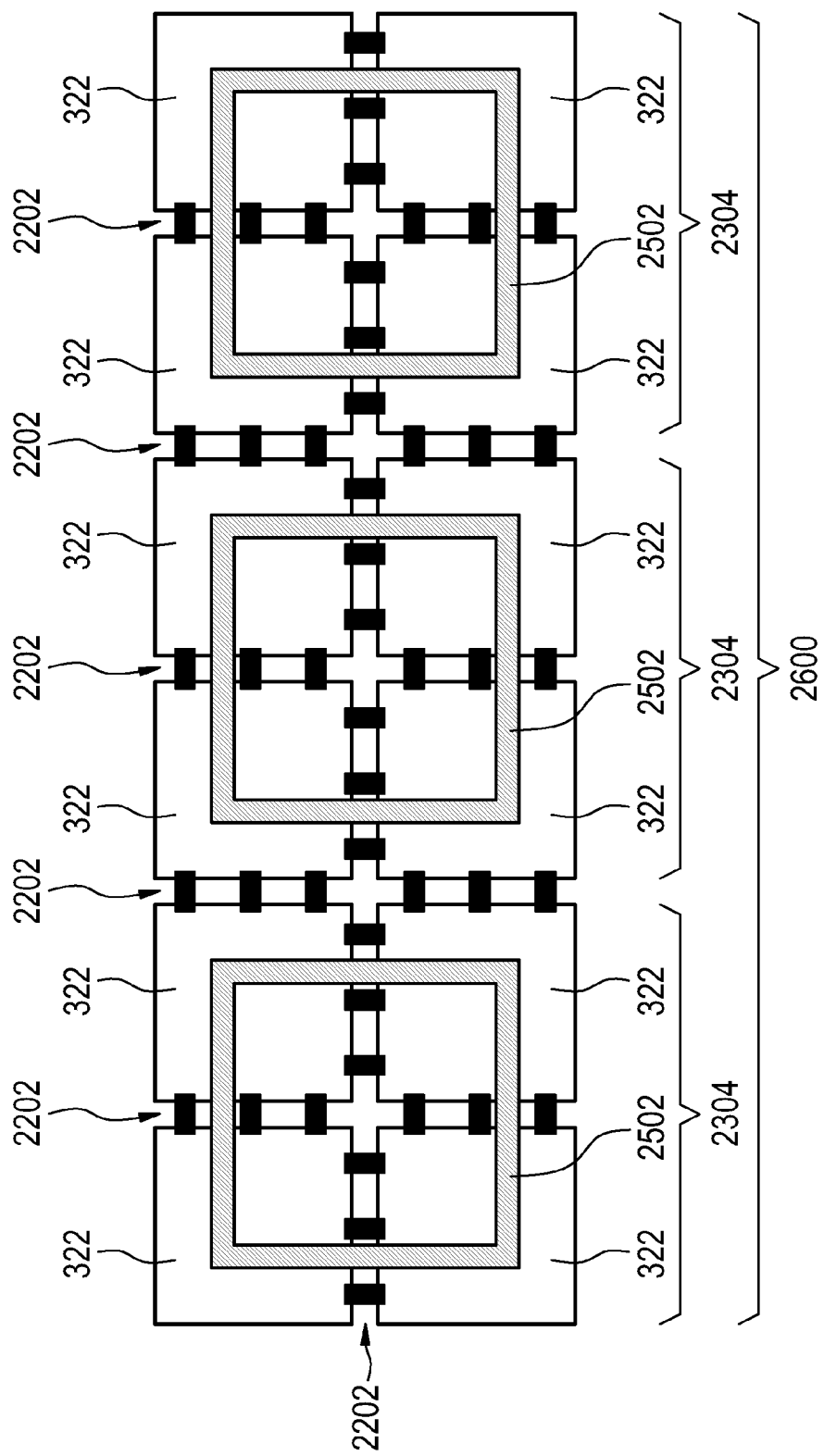
FIG. 26 illustrates a coil assembly according to a further embodiment of the invention.

FIG. 26 shows a coil assembly according to an alternative embodiment of the invention. The coil assembly 2600 shown in FIG. 26 is similar to that of FIG. 25 except all of the conductive elements 322 are connected by pin diodes 2202. There are no separate radio-frequency shields in this example there is just one large radio-frequency shield.

Figure 27:
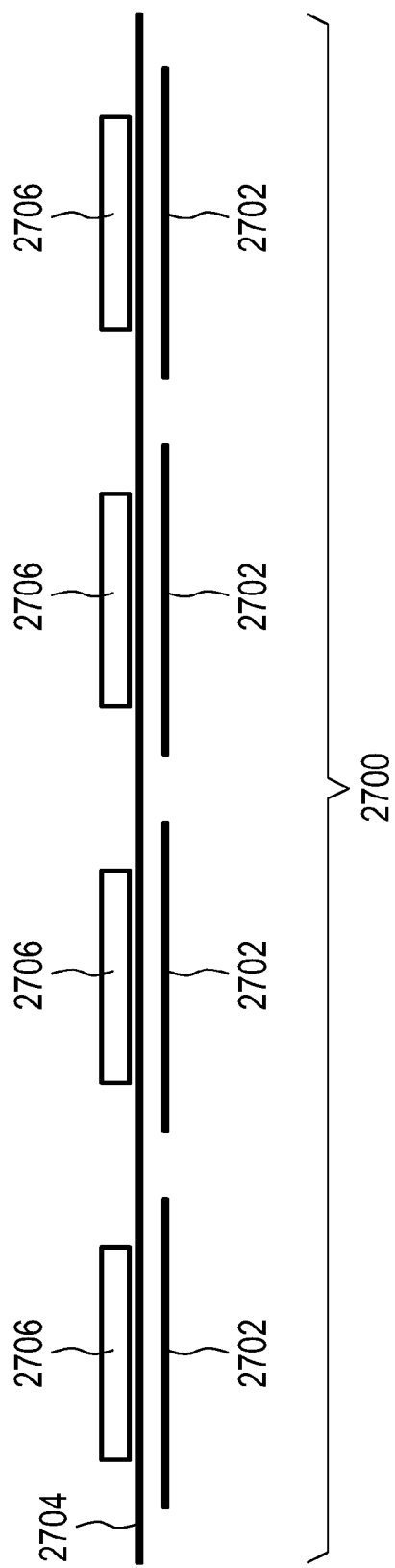
FIG. 27 illustrates an example of the internal components of a coil assembly according to an embodiment of the invention.

FIG. 27 shows an example of the internal components of a coil assembly 2700 according to an embodiment of the invention. There is a collection of coil elements 2702. There is also a switchable radio-frequency screen 2704 adjacent to the coil elements 2702. Also shown are a collection of sensitive electronic components 2706. The switchable radio-frequency screen 2704 is between the electronic components 2706 and the coil elements 2702. In case the coil elements 2702 are used to broadcast or transmit radio-frequency energy the switchable radio-frequency screen 2704 can be put into a closed or blocking state in order to protect the electronic components 2706. The radio-frequency coils are not decoupled and may have separate switchable radio-frequency screens. An electronic component or device such as an S/R switch, preamplifiers, a local radio-frequency amplifier, a PET or positron emission tomography detector is located above the screen. A switchable screen protects the electronics during transmit. In case of a geometrical decoupling of the coils for example there is a via overlap, a suitable screen design could be more evolved.

Embodiments of the invention may have one or more of the following features:

1. Switchable RF screen or conductor pattern, which results in an influence on the field pattern of an RF coil 2. RF screen consists of PCB or conductor material and is structured 3. Screening conductor element is passive or can be made partly resonant to provide a higher screening effect. This is achieved by series capacitors (discrete or distributed)

4. The coil setup can have an additional receive coil layer.

5. Receive coil layer can be externally mechanically connected and supplied via common galvanic or optical or inductive, wireless connection.

6. Individual RF screen elements are electromagnetically separated (low impedance) to suppress waveguide effects and thus uncontrollable mode patterns and SAR values 7. PIN or MEM switching electronics.

8. Arrangement with described characteristics such as Flex L,M,S as transmit tx/rx array 9. Arrangement with described characteristics for combined Tx/Rx arrays consisting of loop and TEM stripline structures.

10. Coil element with electronic retuning device to compensate switching shield effect.

11. Double resonant coil element, with switchable screen. The coil element does not require a PIN switch, as 2nd resonance is tuned by shield to MR resonance frequency.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS

300 magnetic resonance imaging system
304 magnet
306 bore of magnet
308 imaging zone
310 magnetic field gradient coils
312 magnetic field gradient coil power supply
314 coil assembly
315 first surface
316 transceiver
317 coil elements
318 subject
319 radio frequency shield
320 subject support
322 conductive element
324 radio frequency switch
325 radio frequency shield controller
326 computer system
328 hardware interface
330 processor
332 user interface
336 computer storage
338 computer memory
340 pulse sequence (sensitivity encoding pulse sequence)
342 magnetic resonance data
344 magnetic resonance image
350 control module
352 image reconstruction module
400 magnetic resonance imaging system
416 transmitter
418 receiver
420 receiver coil
500 coil assembly
502 receiver coil elements
504 transmitter coil elements
506 radio frequency shield
508 connection to receiver
5 510 connection to transmitter
512 connection to radio frequency shield controller 514 first surface
516 second surface
600 coil assembly
602 matching network element
604 connection to transceiver
700 coil assembly
702 coil elements
704 radio frequency shield
706 portion of subject within imaging zone
708 shielded portion of subject
900 distance
902 magnetic field component
904 no-RF screen
906 with open or transparent RF screen
908 with closed RF screen
1002 Electric field component
1600 subject
1602 receive coil segment
1604 transmit coil segment
1606 switchable radio frequency screen
1608 shielded portion of subject
1610 radiation prevented by RF screen
1700 radio frequency shield
1800 radio frequency shield
1900 radio frequency shield
2000 radio frequency shield
2100 patterned printed circuit board
2102 low loss substrate
2104 copper
2200 radio frequency shield
2202 PIN diodes
2300 coil assembly
2302 TEM transmit coils
2304 separate radio frequency shield
2400 coil assembly
2402 butterfly coil
2500 coil assembly
2502 loop coil
2600 coil assembly
2700 coil assembly
2702 coil elements
2704 switchable RF screen
2706 electronic component

The invention claimed is:

1. A coil assembly for radiating radio frequency energy and/or receiving radio frequency energy during the acquisition of magnetic resonance data, wherein the coil assembly has a first surface configured for being directed towards an imaging zone of a magnetic resonance imaging system, wherein the coil assembly further comprises at least one coil element, wherein the coil assembly further comprises a radio frequency shield switchable between a radio-frequency blocking state and a radio-frequency transparent state, wherein the at least one coil element is between the first surface and the radio frequency shield, wherein the radio frequency shield comprises at least two conductive elements, wherein the radio frequency shield comprises a radio frequency switch configured for electrically connecting the at least two conductive elements when the radio frequency shield is in the radio-frequency blocking state, wherein the radio frequency switch is further configured for electrically disconnecting the at least two conductive elements when the radio frequency shield is in the radio-frequency transparent state, wherein the coil assembly further comprises at least one receiver coil configured for receiving radio frequency transmissions from atomic spins within the imaging zone during the acquisition of the magnetic resonance data, wherein the at least one coil element is located between the radio frequency shield and the at least one receiver coil, wherein the coil assembly has a second surface configured for receiving a portion of the subject, wherein the second surface is directed away from the imaging zone, and wherein the radio frequency shield is between the second surface and the at least one coil element.

2. A magnetic resonance imaging system for acquiring magnetic resonance data from a subject, wherein the magnetic resonance imaging system comprises:
 a magnet for providing an imaging zone; and
 a coil assembly accordingly to claim 1 configured for radiating radio frequency energy into the imaging zone and/or receiving radio frequency energy from the imaging zone during the acquisition of the magnetic resonance imaging data.

3. The magnetic resonance imaging system of claim 2, wherein the coil assembly is configured for radiating radio frequency energy into and for receiving radio frequency energy from the imaging zone during the acquisition of magnetic resonance imaging, wherein the magnetic resonance imaging system further comprises:
 a processor for controlling the operation of the magnetic resonance imaging system;
 a memory for storing machine executable instructions for execution by the processor, wherein execution of the instructions causes the processor to:
  acquire the magnetic resonance data by controlling the magnetic resonance imaging system;
  switch the radio frequency shield into the radio frequency blocking state when radiating radio frequency energy by the coil assembly; and
  switch the radio frequency shield into the radio frequency transparent state during reception of the radio frequency transmission by the coil assembly.

4. The magnetic resonance imaging system of claim 3, wherein the at least one coil element comprises a controllable matching network element for impedance matching of the at least one coil element, wherein execution of the instructions further causes the processor to adjust the controllable matching network to compensate for the effect of the impedance change of the at least one coil element due to switching the radio frequency shield between the radio frequency blocking state and the radio frequency transparent state.

5. The magnetic resonance imaging system of claim 3, wherein the memory further comprises a sensitivity encoding pulse sequence, wherein the magnetic resonance data is acquired by executing the sensitivity encoding pulse sequence.

6. The magnetic resonance imaging system of claim 2, wherein the coil assembly is configured for radiating radio frequency energy into the imaging zone during the acquisition of magnetic resonance imaging, wherein the magnetic resonance imaging system further comprises:
 processor for controlling the operation of the magnetic resonance imaging system;
 a memory for storing machine executable instructions for execution by the processor, wherein execution of the instructions causes the processor to:
  acquire the magnetic resonance data by controlling the magnetic resonance imaging system;
  switching the radio frequency shield into the radio frequency blocking state when radiating radio frequency energy by the coil assembly; and switching the radio frequency shield into the radio frequency transparent state during reception of the radio frequency energy by the receiver coil.

7. The magnetic resonance imaging system of claim 2, wherein the coil assembly is further configured such that the at least one coil element is switched to first resonant frequency when the radio frequency shield is switched to the radio frequency blocking state, and wherein the coil assembly is further configured such that the at least one coil element is switched to a second resonant frequency when the radio frequency shield is switched to the radio frequency transparent state.

8. The coil assembly of claim 1, wherein radio frequency switch comprises at least one capacitor configured for tuning the radio frequency shield to a blocking frequency when the radio frequency shield is in the radio frequency blocking state.

9. The coil assembly of claim 1, wherein the radio frequency switch comprises any one of the following: a PIN diode, micro electromechanical switch, and a mechanical relays.

10. The coil assembly of claim 1, further comprising multiple coil elements, wherein the radio frequency shield comprises multiple shield elements each comprising at least two conductive elements, wherein each of the multiple shield elements is configured for being switched independently between the radio frequency blocking state and the radio frequency transparent state.

11. The coil assembly of claim 1 wherein the at least one coil element is any one of the following: a loop coil, a butterfly coil, a stripline coil, a TEM transmit coil, a TEM volume coil, a TEM coil, and a birdcage coil.

12. The coil assembly of claim 1, further comprising an electronic component wherein the radio frequency shield is between the at least one coil element and the electronic component, wherein the radio frequency shield is configured for shielding the electronic component from the at least one coil element.

13. A non-transitory computer program product comprising machine executable code for execution of a processors controlling a magnetic resonance imaging system, wherein the magnetic resonance imaging system comprises a magnet for providing an imaging zone, wherein the magnetic resonance imaging system further comprises a coil assembly according to claim 1, wherein the coil assembly is configured for radiating radio frequency energy and for receiving radio frequency energy, and wherein execution of the instructions causes the processor to:
    acquire the magnetic resonance data by controlling the magnetic resonance imaging system;
    switch the radio frequency shield into the radio frequency blocking state when radiating radio frequency energy by the coil assembly; and
    switch the radio frequency shield into the radio frequency transparent state during reception of the radio frequency transmission by the coil assembly.

* * * * *